United States Patent
Chiu

(10) Patent No.: US 11,935,851 B2
(45) Date of Patent: Mar. 19, 2024

(54) SEMICONDUCTOR STRUCTURE HAVING POLYGONAL BONDING PAD

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 151 days.

(21) Appl. No.: 17/543,194

(22) Filed: Dec. 6, 2021

(65) Prior Publication Data

US 2023/0178503 A1 Jun. 8, 2023

(51) Int. Cl.
 *H01L 23/00* (2006.01)

(52) U.S. Cl.
 CPC .............. *H01L 24/05* (2013.01); *H01L 24/03* (2013.01); *H01L 24/04* (2013.01); *H01L 24/13* (2013.01); *H01L 24/11* (2013.01); *H01L 2224/03462* (2013.01); *H01L 2224/03845* (2013.01); *H01L 2224/0401* (2013.01); *H01L 2224/04042* (2013.01); *H01L 2224/04073* (2013.01); *H01L 2224/05008* (2013.01); *H01L 2224/05012* (2013.01); *H01L 2224/05016* (2013.01); *H01L 2224/05078* (2013.01); *H01L 2224/05082* (2013.01); *H01L 2224/05563* (2013.01); *H01L 2224/11912* (2013.01); *H01L 2224/13027* (2013.01)

(58) Field of Classification Search
 CPC ....................................................... H01L 24/05
 See application file for complete search history.

(56) References Cited

U.S. PATENT DOCUMENTS

2011/0101532 A1* 5/2011 Pohl .................. H01L 21/76873
 205/183
2021/0125860 A1 4/2021 Yen et al.

FOREIGN PATENT DOCUMENTS

CN 105321903 A 2/2016

\* cited by examiner

*Primary Examiner* — William A Harriston
(74) *Attorney, Agent, or Firm* — Muncy, Geissler, Olds & Lowe, P.C.

(57) ABSTRACT

The present disclosure provides a semiconductor structure including a substrate; a redistribution layer (RDL) disposed over the substrate, and including a dielectric layer over the substrate, a conductive plug extending within the dielectric layer, and a bonding pad adjacent to the conductive plug and surrounded by the dielectric layer; and a conductive bump disposed over the conductive plug, wherein the bonding pad is at least partially in contact with the conductive plug and the conductive bump. Further, a method of manufacturing the semiconductor structure is also provided.

20 Claims, 21 Drawing Sheets

SEMICONDUCTOR STRUCTURE HAVING POLYGONAL BONDING PAD

TECHNICAL FIELD

The present disclosure relates to a semiconductor structure. Particularly, the present disclosure relates to a semiconductor structure having a bonding pad that is at least partially exposed through a redistribution layer (RDL) for receiving an external interconnect structure.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductive substrate, and patterning the material layers using lithography and etching processes to form microelectronic components, including transistors, diodes, resistors and/or capacitors, on or in the semiconductive substrate.

The semiconductor industry continues to improve integration density of microelectronic components by continual reduction of minimum feature size, which allows more components to be integrated into a given area. For example, in an attempt to further increase density of the semiconductor device, stacking of two or more components has been investigated. It is therefore desirable to develop improvements that address related manufacturing challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate; a redistribution layer (RDL) disposed over the substrate, wherein the RDL includes a dielectric layer over the substrate, a conductive plug extending within the dielectric layer, and a bonding pad adjacent to the conductive plug and surrounded by the dielectric layer; and a conductive bump disposed over the conductive plug, wherein the bonding pad is at least partially in contact with the conductive plug and the conductive bump.

In some embodiments, a first surface of the conductive plug and a second surface of the bonding pad are exposed through the dielectric layer.

In some embodiments, the first surface of the conductive plug is substantially coplanar with the second surface of the bonding pad.

In some embodiments, the first surface of the conductive plug and the second surface of the bonding pad are in contact with a seed layer of the conductive bump.

In some embodiments, the first surface of the conductive plug, the second surface of the bonding pad and a third surface of the dielectric layer are substantially coplanar.

In some embodiments, the first surface of the conductive plug is entirely covered by the conductive bump.

In some embodiments, a first portion of the second surface of the bonding pad is covered by the conductive bump, a second portion of the second surface is exposed through the dielectric layer and exposed by the conductive bump, and the first portion is substantially smaller than the second portion.

In some embodiments, a top cross section of the bonding pad has an annular shape, a fan shape or a polygonal shape.

In some embodiments, a height of the conductive plug is substantially greater than a thickness of the bonding pad.

In some embodiments, the RDL includes a conductive member electrically connecting the conductive plug to the substrate.

In some embodiments, the conductive member is electrically connected to the conductive bump through the conductive plug.

In some embodiments, the conductive member is electrically connected to the bonding pad through the conductive plug.

In some embodiments, the conductive bump is electrically connected to a device disposed on the substrate through the conductive member and the conductive plug.

In some embodiments, the conductive member includes a pad portion extending horizontally within the dielectric layer, and a via portion coupled with the pad portion and extending vertically from the pad portion.

In some embodiments, the conductive plug is in contact with the bonding pad and the pad portion.

Another aspect of the present disclosure provides a semiconductor structure. The semiconductor structure includes a first substrate; and a redistribution layer (RDL) disposed over the first substrate, wherein the RDL includes a dielectric layer over the first substrate, a conductive plug extending within the dielectric layer, and a bonding pad surrounded by the dielectric layer and in contact with the conductive plug, wherein the conductive plug is at least partially surrounded by the bonding pad.

In some embodiments, the semiconductor structure further includes a conductive bump covering the conductive plug and partially covering the bonding pad.

In some embodiments, a width of the conductive plug is substantially less than a width of the conductive bump.

In some embodiments, an interface between the conductive plug and the bonding pad is disposed under the conductive bump.

In some embodiments, the conductive bump is disposed over and bonded with an interconnect structure of a second substrate.

In some embodiments, the bonding pad includes a first bonding pad and a second bonding pad separated from the first bonding pad, and the conductive plug is disposed between the first bonding pad and the second bonding pad.

In some embodiments, the conductive plug is in contact with the first bonding pad and the second bonding pad.

In some embodiments, the semiconductor structure further includes a bonding wire disposed over and bonded with the bonding pad.

In some embodiments, the first substrate includes a plurality of devices disposed thereon and a plurality of isolations separating the plurality of devices.

Another aspect of the present disclosure provides a method of manufacturing a semiconductor structure. The method includes steps of providing a substrate and a redistribution layer (RDL) disposed over the substrate, wherein the RDL includes a dielectric layer over the substrate and a conductive plug extending within the dielectric layer; disposing an etch stop layer over the RDL; disposing a first patterned photoresist over the etch stop layer; removing a portion of the dielectric layer and a portion of the etch stop layer that is exposed through the first patterned photoresist; removing the first patterned photoresist; disposing a first seed layer over the etch stop layer and a portion of the dielectric layer that is exposed through the etch stop layer; disposing a second patterned photoresist over the first seed layer; disposing a conductive material over a portion of the first seed layer that is exposed through the second patterned photoresist; removing the second patterned photoresist; removing the etch stop layer; and removing a portion of the conductive material that protrudes from the dielectric layer to form a bonding pad adjacent to the conductive plug and surrounded by the dielectric layer.

In some embodiments, the first seed layer disposed over the etch stop layer is in contact with the conductive plug.

In some embodiments, the bonding pad includes the seed layer and the conductive material.

In some embodiments, a portion of the conductive material protrudes from the etch stop layer after the removal of the second patterned photoresist.

In some embodiments, the removal of the portion of the dielectric layer that is exposed through the first patterned photoresist includes forming an opening extending into the dielectric layer and disposed adjacent to the conductive plug.

In some embodiments, the conductive plug is at least partially exposed after the formation of the opening.

In some embodiments, the opening surrounds the conductive plug.

In some embodiments, the second patterned photoresist fills a portion of the opening.

In some embodiments, the second patterned photoresist is at least partially surrounded by the first seed layer.

In some embodiments, the method further includes disposing a dielectric material within the opening and over the etch stop layer; and removing a portion of the dielectric material that is disposed over the etch stop layer.

In some embodiments, the method further includes disposing a second seed layer over the bonding pad, the conductive plug and the dielectric layer; disposing a third patterned photoresist over the second seed layer; and forming a conductive bump over a portion of the second seed layer that is exposed through the third patterned photoresist.

In conclusion, because the bonding pad is disposed adjacent to the conductive plug in the RDL, the bonding pad can receive an external interconnect structure such as wire bonding. Further, the bonding pad can be formed in various shapes so that the bonding pad can receive the external interconnect structure from different directions around the conductive plug. Therefore, a flexible interconnection and routing of the semiconductor structure can be achieved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
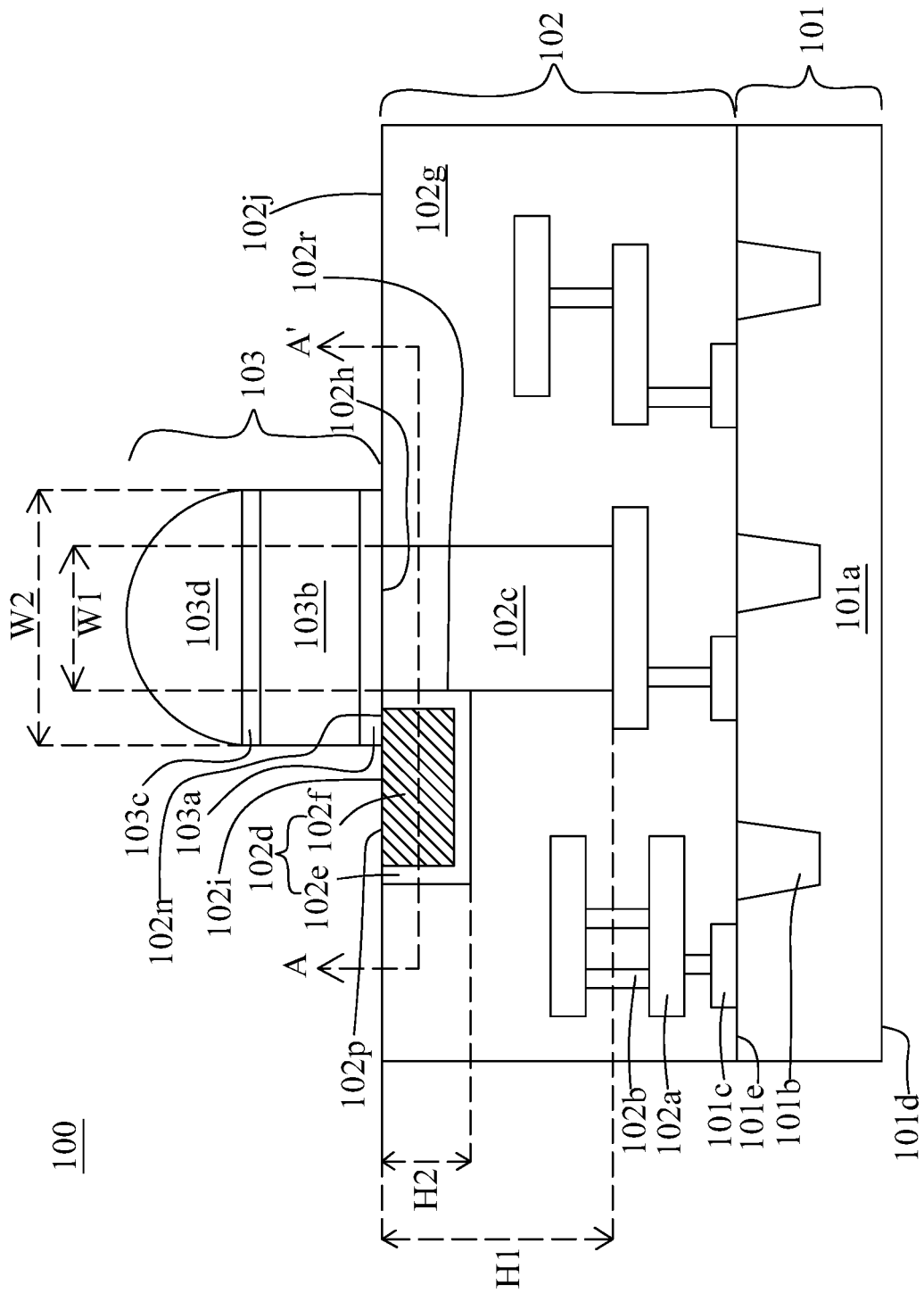
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure 100 in accordance with some embodiments of the present disclosure. In some embodiments, the semiconductor structure 100 is a part of a die, a package or a device. In some embodiments, the semiconductor structure 100 is a flip-chip package. In some embodiments, the semiconductor structure 100 includes a substrate 101, a redistribution layer (RDL) 102 disposed over the substrate 101, and a conductive bump 103 disposed over the RDL 102.

In some embodiments, the substrate 101 is a part of a wafer. In some embodiments, the substrate 101 is sawn from a wafer by dicing, cutting or another suitable operation. In some embodiments, the substrate 101 includes semiconductive material such as silicon. In some embodiments, the substrate 101 is a silicon substrate. In some embodiments, the substrate 101 includes a semiconductive layer 101a, several isolations 101b and several devices 101c disposed over the semiconductive layer 101a and separated by the isolations 101b.

In some embodiments, the semiconductive layer 101a includes a back side 101d and a front side 101e opposite to the back side 101d. The back side 101d is disposed on a supporting substrate during fabrication of the semiconductor structure 100. The devices 101c are formed over the front side 101e and configured to electrically connect to an external circuitry. In some embodiments, the devices 101c are metal oxide semiconductor (MOS) devices. In some embodiments, the isolations 101b are shallow trench isolations (STI).

In some embodiments, the RDL 102 is disposed over the front side 101e of the substrate 101. The RDL 102 re-routes a path of a circuitry from the devices 101c over the substrate 101 to the conductive bump 103. In some embodiments, the RDL 102 includes a conductive member (102a and 102b), a conductive plug 102c, a bonding pad 102d and a dielectric layer 102g surrounding the conductive member (102a and 102b), the conductive plug 102c and the bonding pad 102d.

In some embodiments, the dielectric layer 102g is disposed over the front side 101e of the substrate 101 and covers the devices 101c. The dielectric layer 102g includes dielectric material such as oxide, nitride, silicon dioxide, silicon nitride, silicon oxynitride, silicon carbide, polymer or the like. In some embodiments, the dielectric layer 102g includes several dielectric layers stacked over each other. In some embodiments, each dielectric layer includes materials that are same as or different from materials in others of the dielectric layers.

In some embodiments, the conductive member (102a and 102b) is an interconnection electrically connected to the substrate 101. The conductive member (102a and 102b) is disposed within the dielectric layer 102g. In some embodiments, the conductive member (102a and 102b) includes conductive material such as gold, silver, copper, nickel, aluminum or the like. In some embodiments, the conductive member (102a and 102b) includes a pad portion 102a extending horizontally within the dielectric layer 102g, and a via portion 102b coupled to the pad portion 102a and extending vertically within the dielectric layer 102g and away from the pad portion 102a.

In some embodiments, the conductive plug 102c extends vertically within the dielectric layer 102g and toward the conductive member (102a and 102b). In some embodiments, the conductive plug 102c is disposed on the pad portion 102a. The conductive plug 102c is electrically connected to the substrate 101 through the conductive member (102a and 102b). In some embodiments, the conductive plug 102c is surrounded by the dielectric layer 102g. In some embodiments, a first surface 102h of the conductive plug 102c is exposed through the dielectric layer 102g. In some embodiments, the conductive plug 102c includes conductive material such as gold, silver, copper, nickel, aluminum or the like.

In some embodiments, the bonding pad 102d is disposed adjacent to the conductive plug 102c and is surrounded by the dielectric layer 102g. In some embodiments, the bonding pad 102d is at least partially in contact with the conductive plug 102c. The bonding pad 102d is electrically connected to the conductive plug 102c. In some embodiments, a sidewall of the bonding pad 102d is in contact with a sidewall of the conductive plug 102c. In some embodiments, the bonding pad 102d is electrically connected to the conductive member (102a and 102b) through the conductive plug 102c. In some embodiments, the bonding pad 102d includes conductive material such as gold, silver, copper, nickel, aluminum or the like.

In some embodiments, the bonding pad 102d includes a seed layer 102e and a pad 102f surrounded by the seed layer 102e. In some embodiments, the seed layer 102e is in contact with the conductive plug 102c. In some embodiments, the seed layer 102e is surrounded by the dielectric layer 102g and the conductive plug 102c. In some embodiments, the seed layer 102e is a single layer or a composite stack and is formed with material such as copper, titanium, tungsten, or a combination thereof. In some embodiments, the pad 102f is in contact with and entirely surrounded by the seed layer 102e. In some embodiments, the pad 102f includes conductive material such as copper, silver, gold or the like.

Figure 4:
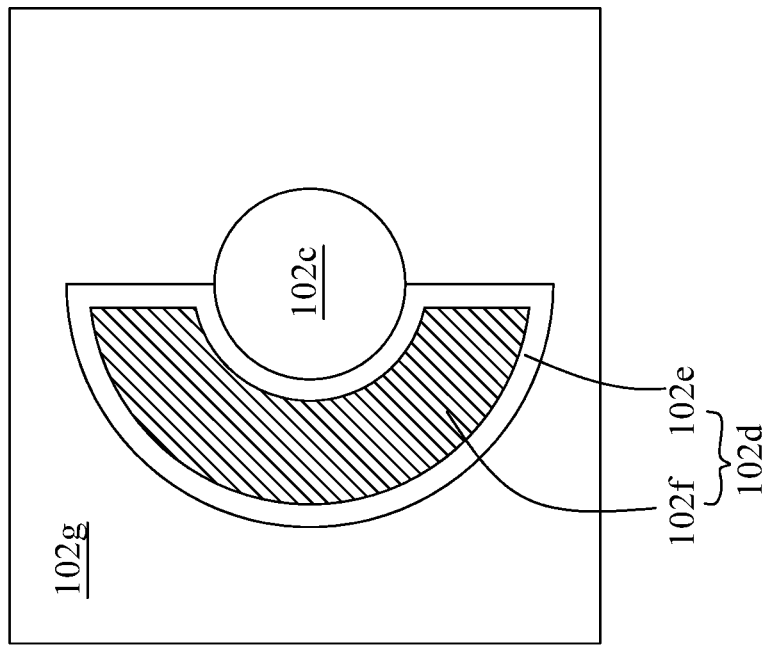
FIG. 4 is an embodiment of a top cross-sectional view of the semiconductor structure along a line A-A' in FIG. 1.
Figure 3:
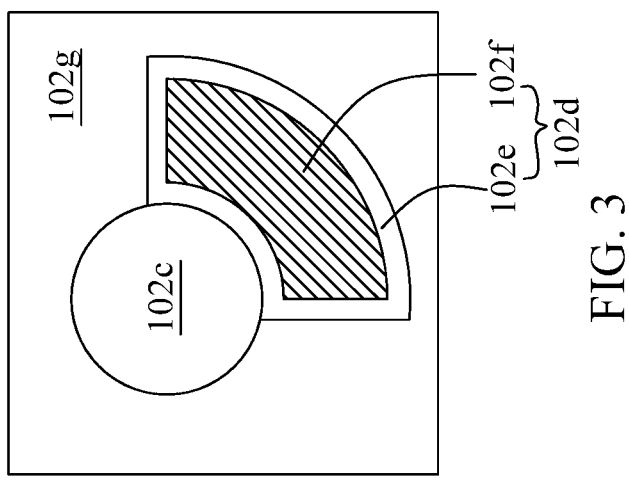
FIG. 3 is an embodiment of a top cross-sectional view of the semiconductor structure along a line A-A' in FIG. 1.
Figure 2:
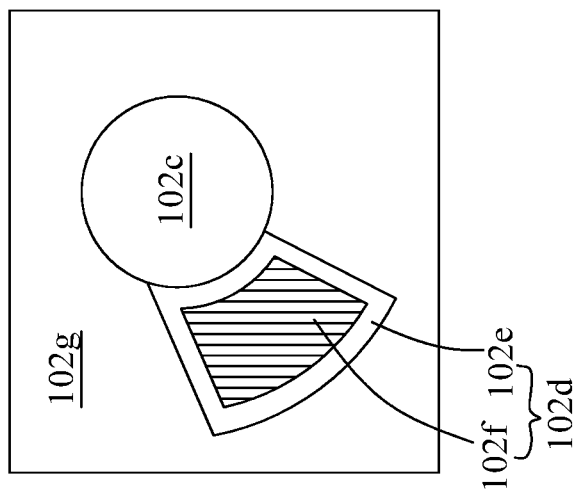
FIG. 2 is an embodiment of a top cross-sectional view of the semiconductor structure along a line A-A' in FIG. 1.

In some embodiments, the conductive plug 102c is at least partially surrounded by the bonding pad 102d. In some embodiments, a top cross section of the bonding pad 102d along a line A-A' in FIG. 1 can be any of various shapes. In some embodiments, the top cross section of the bonding pad 102d is a polygonal shape. For example, as shown in FIG. 2, the top cross section of the bonding pad 102d is a fan shape. For example, as shown in FIGS. 3 and 4, the top cross section of the bonding pad 102d is a quarter annular shape or a half annular shape.

Figure 5:
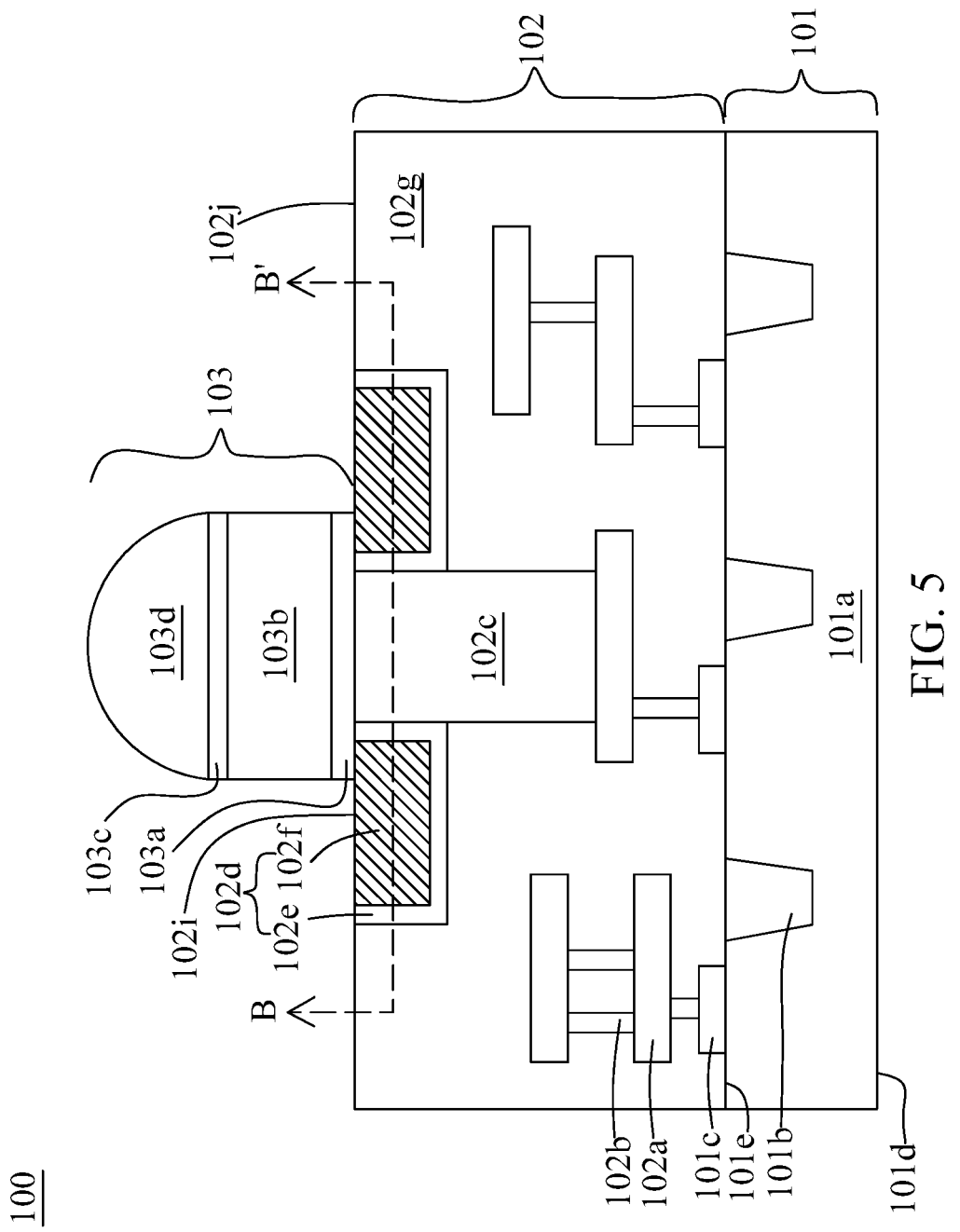
FIG. 5 is a cross-sectional view of a semiconductor structure in accordance with some embodiments of the present disclosure.
Figure 6:
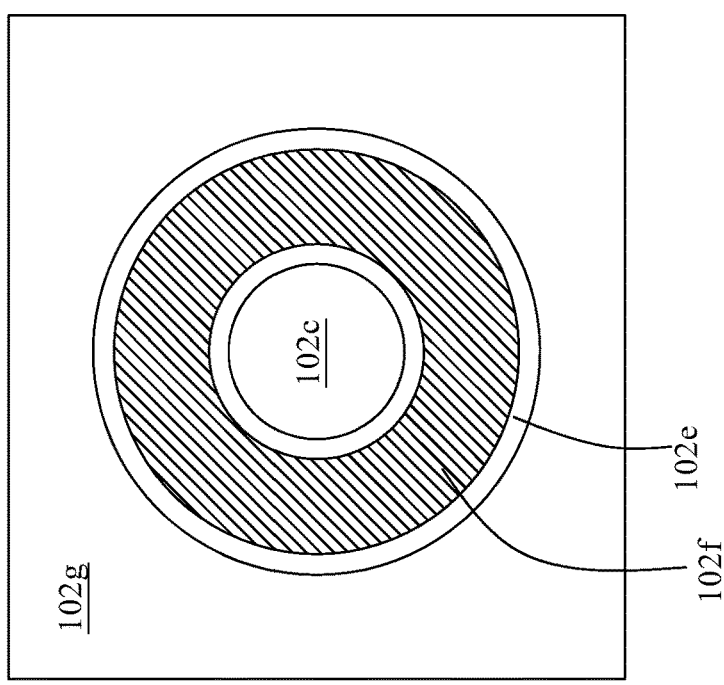
FIG. 6 is an embodiment of a top cross-sectional view of the semiconductor structure along a line B-B' in FIG. 5.

In some embodiments, the top cross section of the bonding pad 102d along a line B-B' in FIG. 5 is an annular shape as shown in FIG. 6.

Figure 7:
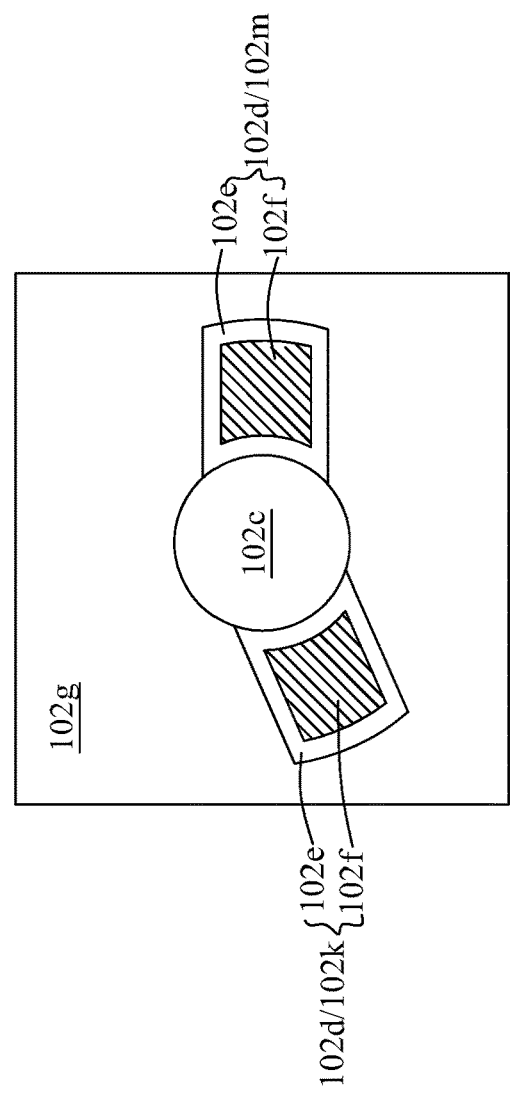
FIG. 7 is an embodiment of a top cross-sectional view of the semiconductor structure along a line B-B' in FIG. 5.

In some embodiments as shown in FIGS. 5 and 7, the bonding pad 102d includes a first bonding pad 102k and a second bonding pad 102m separated from the first bonding pad 102k. The conductive plug 102c is disposed between the first bonding pad 102k and the second bonding pad 102m. In some embodiments, the conductive plug 102c is in contact with the first bonding pad 102k and the second bonding pad 102m. In some embodiments, a top cross section of the first bonding pad 102k and a top cross section of the second bonding pad 102m are both fan shapes.

Referring back to FIG. 1, in some embodiments, the bonding pad 102d includes a second surface 102i exposed through the dielectric layer 102g. In some embodiments, the second surface 102i of the bonding pad 102d is substantially coplanar with the first surface 102h of the conductive plug 102c. In some embodiments, the second surface 102i includes a top surface of the seed layer 102e and a top surface of the pad 102f.

In some embodiments, the conductive plug 102c has a height H1 substantially greater than a height H2 of the bonding pad 102d. The height H1 of the conductive plug 102c extends from the first surface 102h toward the pad portion 102a. The height H2 of the bonding pad 102d extends from the second surface 102i toward the front side 101e of the substrate 101.

In some embodiments, the dielectric layer 102g includes a third surface 102j opposite to the front side 101e of the substrate 101. In some embodiments, the first surface 102h of the conductive plug 102c, the second surface 102i of the bonding pad 102d and the third surface 102j of the dielectric layer 102g are substantially coplanar.

In some embodiments, the conductive bump 103 is disposed over the conductive plug 102c. In some embodiments, the conductive bump 103 is disposed over a portion of the bonding pad 102d and the dielectric layer 102g of the RDL 102. In some embodiments, the bonding pad 102d is at least partially in contact with the conductive plug 102c and the conductive bump 103. In some embodiments, the conductive member (102a and 102b) is electrically connected to the conductive bump 103 through the conductive plug 102c. In some embodiments, the conductive bump 103 is electrically connected to the device 101c disposed on the substrate 101. In some embodiments, the first surface 102h of the conductive plug 102c and the second surface 102i of the bonding pad 102d are in contact with the conductive bump 103.

In some embodiments, an interface 102r between the conductive plug 102c and the bonding pad 102d is disposed under the conductive bump 103. In some embodiments, the conductive bump 103 is disposed over and bonded with an interconnect structure of another substrate (not shown). For example, the semiconductor structure 100 is a flip-chip package, so the semiconductor structure 100 as shown in FIG. 1 is turned upside down and the conductive bump 103 is disposed over and bonded with an interconnect structure such as a bond pad of another substrate disposed under the semiconductor structure 100.

In some embodiments, the first surface 102h is entirely covered by and in contact with the conductive bump 103. In some embodiments, a first portion 102n of the second surface 102i covered by the conductive bump 103 is substantially smaller than a second portion 102p of the second surface 102i exposed through the dielectric layer 102g and exposed by the conductive bump 103. In some embodiments, the second portion 102p of the second surface 102i of the bonding pad 102d is configured to receive a bonding wire to electrically connect the semiconductor structure 100 to another semiconductor structure or another substrate. Since the bonding pad 102d can be formed in various shapes and sizes as desired, the bonding pad 102d can receive the external interconnect structure such as the bonding wire having different orientations around the conductive plug. Therefore, a flexible interconnection and routing of the semiconductor structure 100 can be achieved.

In some embodiments, the conductive bump 103 includes conductive material such as lead, tin, copper, gold, nickel or the like. In some embodiments, the conductive bump 103 is a ball grid array (BGA) ball, controlled collapse chip connection (C4) bump, micro-bump, pillar or the like. In some embodiments, the conductive plug 102c has a width W1 substantially less than a width W2 of the conductive bump 103.

In some embodiments, the conductive bump 103 includes an under bump metallization (UBM) layer 103a, a metallic layer 103b, a barrier layer 103c and a soldering member 103d. In some embodiments, the UBM layer 103a is disposed on the conductive plug 102c and the dielectric layer 102g. The UBM layer 103a is in contact with the first surface 102h and the third surface 102j. In some embodiments, the UBM layer 103a covers the first surface 102h and partially covers the second surface 102i. In some embodiments, the UBM layer 103a is a seed layer or an adhesion layer of the conductive bump 103 for receiving the metallic layer 130b. In some embodiments, the UBM layer 103a is in contact with the first surface 102h of the conductive plug 102c and the second surface 102i of the bonding pad 102d. In some embodiments, the UBM layer 103a includes titanium, copper, gold or the like. In some embodiments, the UBM layer 103a includes at least two kinds of conductive materials.

In some embodiments, the metallic layer 103b is disposed over the UBM layer 103a and the conductive plug 102c. In some embodiments, the metallic layer 103b includes conductive material such as copper, silver, gold or the like. In some embodiments, the barrier layer 103c is disposed over the metallic layer 103b, the UBM layer 103a and the conductive plug 102c. In some embodiments, the barrier layer 103c is configured to prevent the metallic layer 103b from diffusing into the soldering member 103d. In some embodiments, the barrier layer 103c includes titanium, titanium nitride, tantalum, tantalum nitride, nickel or the like.

In some embodiments, the soldering member 103d is disposed over the barrier layer 103c, the metallic layer 103b and the UBM layer 103a. In some embodiments, the soldering member 103d includes reflowable material. In some embodiments, the soldering member 103d includes tin, lead, silver, copper, nickel or the like. In some embodiments, the soldering member 103d is configured to bond with an interconnect structure of another substrate external to the semiconductor structure 100, such as a bond pad.

Figure 8:
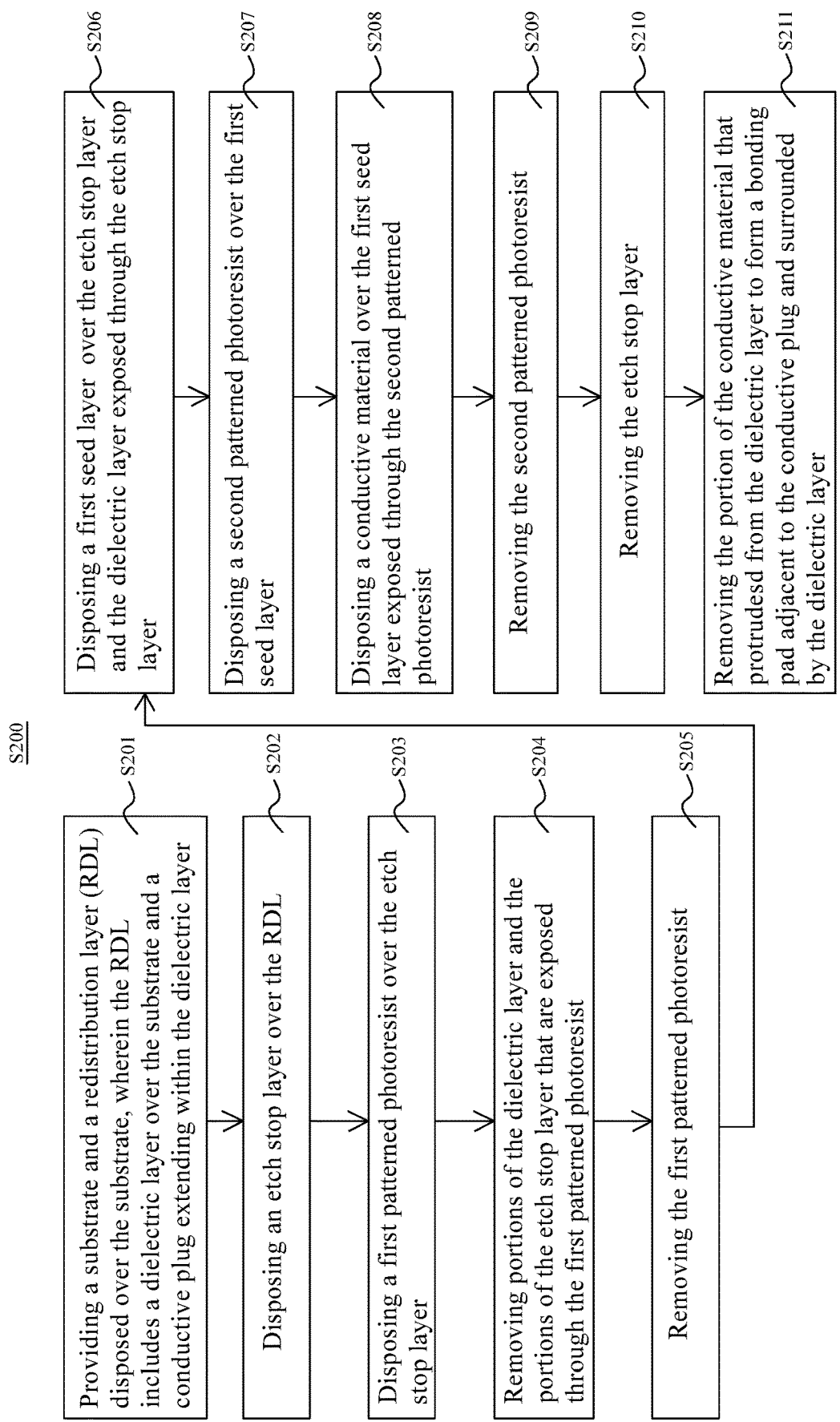
FIG. 8 is a flow diagram illustrating a method of manufacturing a semiconductor structure in accordance with some embodiments of the present disclosure.

FIG. 8 is a flow diagram illustrating a method S200 of manufacturing a semiconductor structure 100 in accordance with some embodiments of the present disclosure, and FIGS. 9 to 36 illustrate cross-sectional views of intermediate stages in formation of the semiconductor structure 100 in accordance with some embodiments of the present disclosure.

The stages shown in FIGS. 9 to 36 are also illustrated schematically in the flow diagram in FIG. 8. In the following discussion, the fabrication stages shown in FIGS. 9 to 36 are discussed in reference to the process steps shown in FIG. 8. The method S200 includes a number of operations and the description and illustration are not deemed as a limitation as the sequence of the operations. The method S200 includes a number of steps (S201, S202, S203, S204, S205, S206, S207, S208, S209, S210 and S211).

Figure 9:
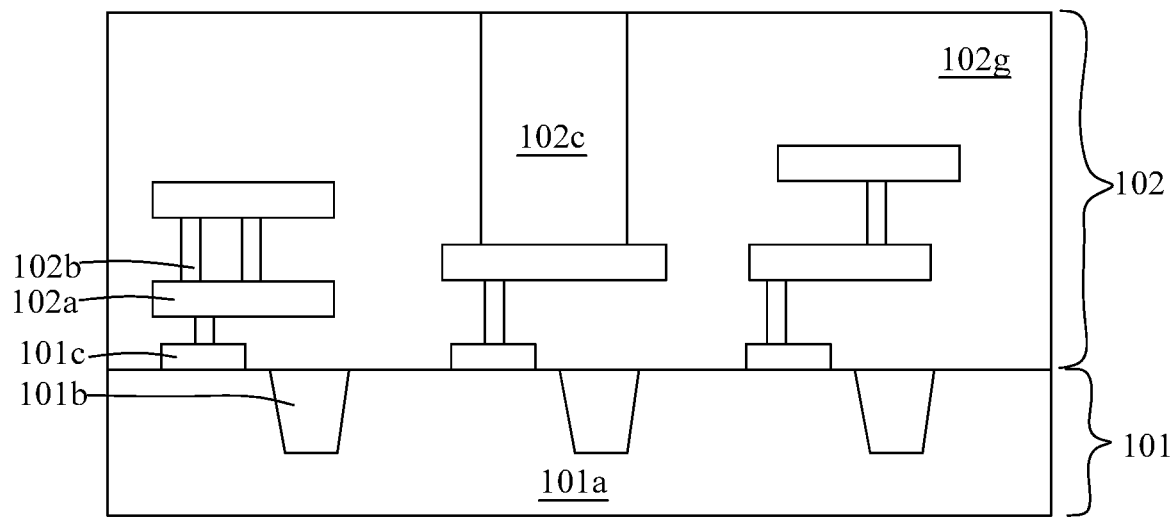
FIGS. 9 to 36 illustrate cross-sectional views of intermediate stages in the formation of a semiconductor structure in accordance with some embodiments of the present disclosure.

Referring to FIG. 9, a substrate 101 and a redistribution layer (RDL) 102 disposed over the substrate 101 are provided according to a step S201 in FIG. 8. In some embodiments, the RDL 102 includes a dielectric layer 102g over the substrate 101 and a conductive plug 102c extending within the dielectric layer 102g. In some embodiments, the RDL 102 is formed by disposing dielectric material over the substrate 101, removing portions of the dielectric material and disposing conductive material to form the conductive plug 102c and a conductive member (102a and 102b).

Figure 10:
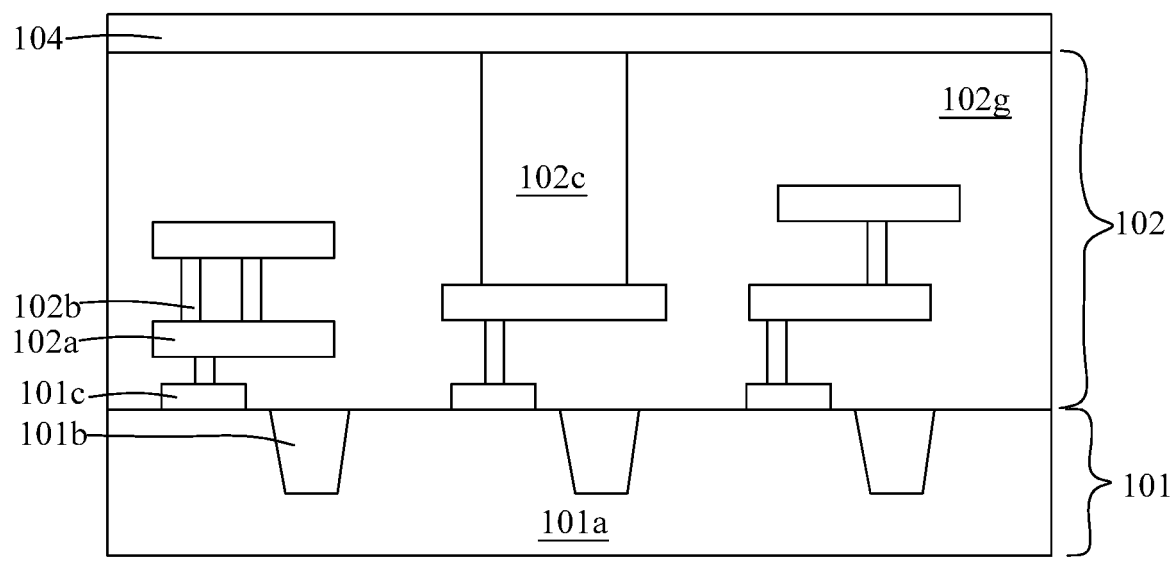

Referring to FIG. 10, an etch stop layer 104 is disposed over the RDL 102 according to a step S202 in FIG. 10. The etch stop layer 104 is disposed on the dielectric layer 102g and the conductive plug 102c. In some embodiments, the etch stop layer 104 is formed of a dielectric material having an etch selectivity different from that of adjacent materials. In some embodiments, the etch stop layer 104 includes nitride, silicon nitride or the like. In some embodiments, the etch stop layer 104 is disposed by chemical vapor deposition (CVD) or any other suitable process.

Figure 11:
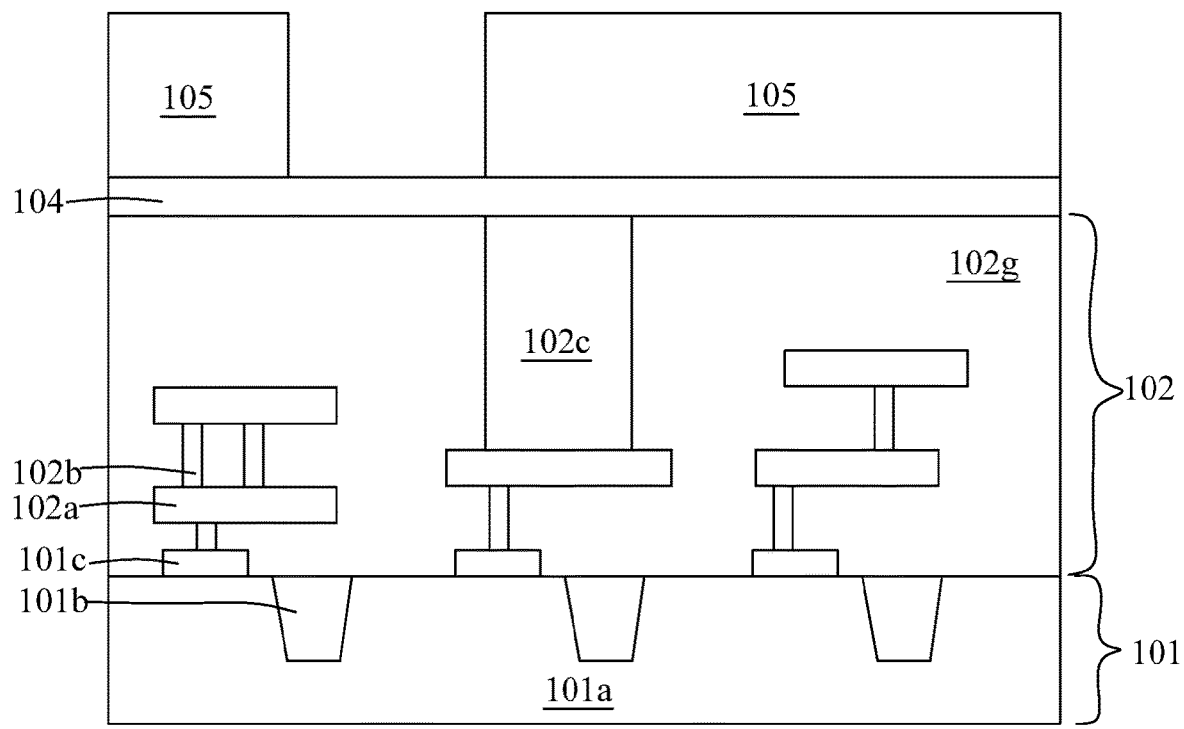
Figure 12:
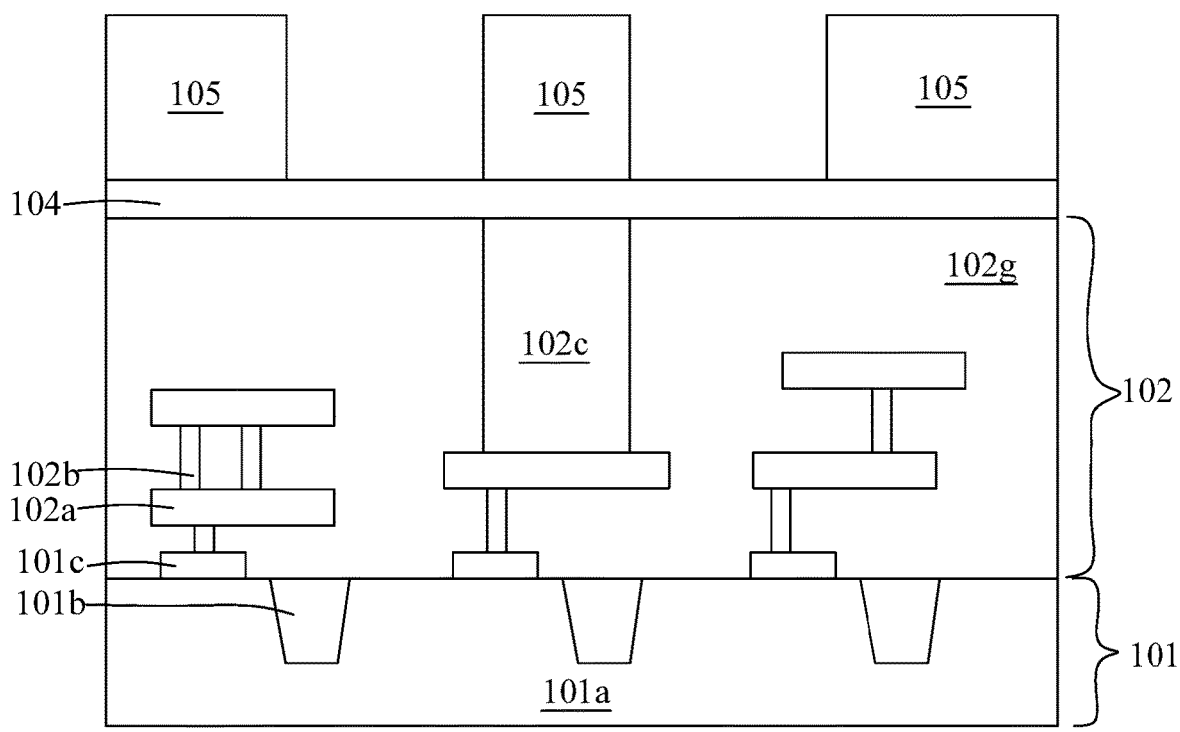

Referring to FIG. 11, a first patterned photoresist 105 is disposed over the etch stop layer 104 according to a step S203 in FIG. 8. In some embodiments, the first patterned photoresist 105 is formed by disposing a photoresist material over the etch stop layer 104, covering some portions of the photoresist material, and then removing exposed portions of the photoresist material to pattern the photoresist material to form the first patterned photoresist 105. In some embodiments, a portion of the etch stop layer 104 is exposed through the first patterned photoresist 105. In some embodiments, several portions of the etch stop layer 104 are exposed through the first patterned photoresist 105 as shown in FIG. 12. In some embodiments, the exposed portion of the photoresist material is configured as an enclosure having an annular shape. In some embodiments, the photoresist material is disposed by spin coating or any other suitable process.

Figure 13:
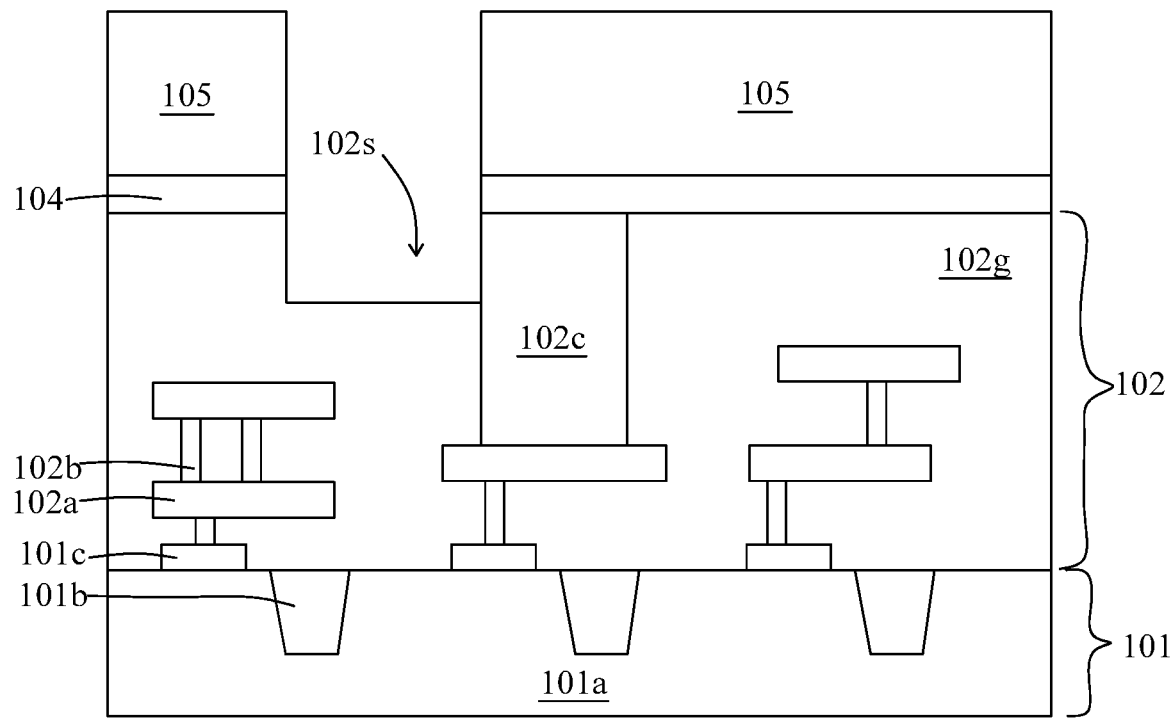
Figure 14:
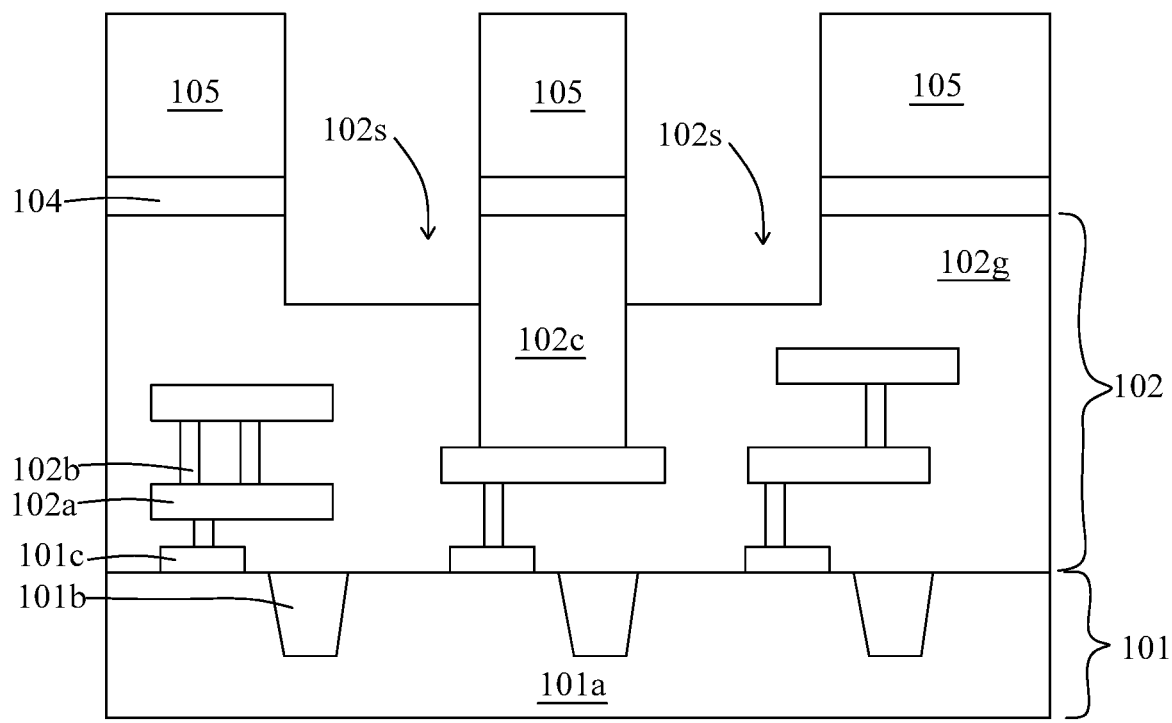

Referring to FIG. 13, portions of the dielectric layer 102g and the portions of the etch stop layer 104 that are exposed through the first patterned photoresist 105 are removed according to a step S204 in FIG. 8. In some embodiments, the portions of the dielectric layer 102g and the portions of the etch stop layer 104 that are exposed through the first patterned photoresist 105 are removed simultaneously or sequentially. The portions of the dielectric layer 102g and the portions of the etch stop layer 104 that are exposed through the first patterned photoresist 105 are removed by an etching process, such as dry etching or any other suitable etching process. In some embodiments, an opening 102s is formed. In some embodiments, the removal of the portions of the dielectric layer 102g that are exposed through the first patterned photoresist 105 includes forming the opening 102s extending into the dielectric layer 102g and disposed adjacent to the conductive plug 102c. In some embodiments, the conductive plug 102c is at least partially exposed after the formation of the opening 102s. In some embodiments, several openings 102s are formed as shown in FIG. 14. In some embodiments, the opening 102s surrounds the conductive plug 102c. In some embodiments, at least a portion of the conductive plug 102c is exposed through the opening 102s.

Figure 15:
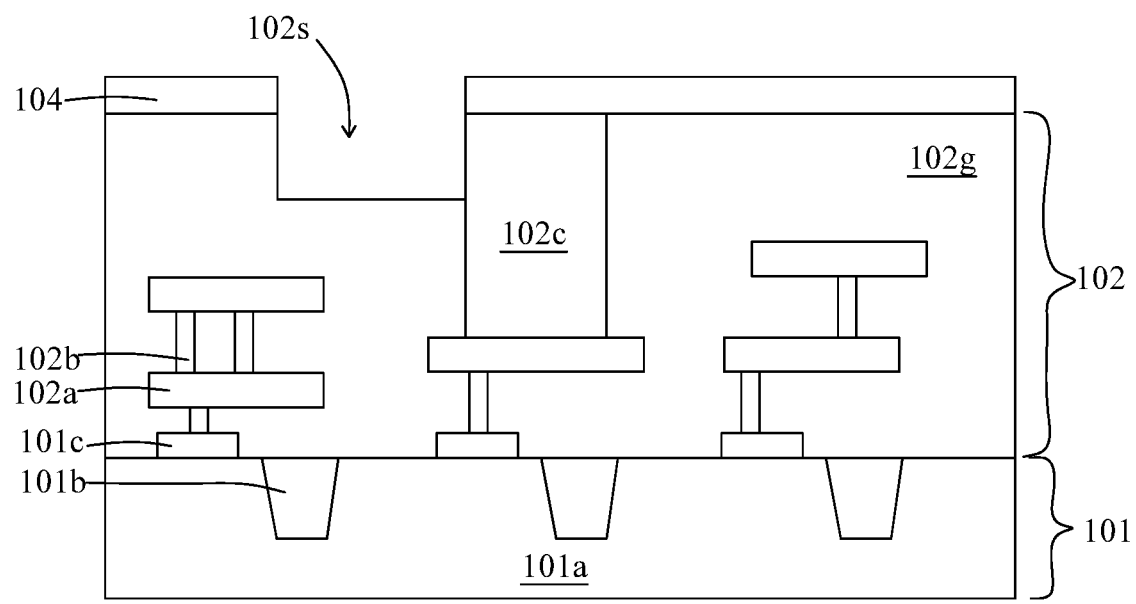
Figure 16:
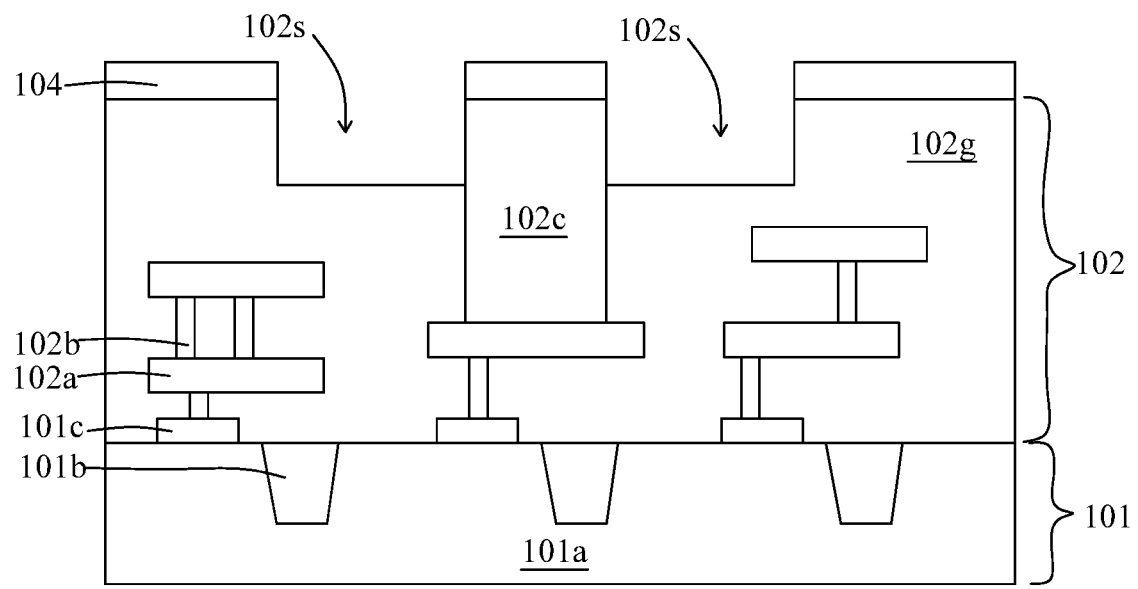

Referring to FIG. 15 or FIG. 16, the first patterned photoresist 105 is removed according to a step S205 in FIG. 8. In some embodiments, the first patterned photoresist 105 is removed by etching, stripping or any other suitable process.

Figure 17:
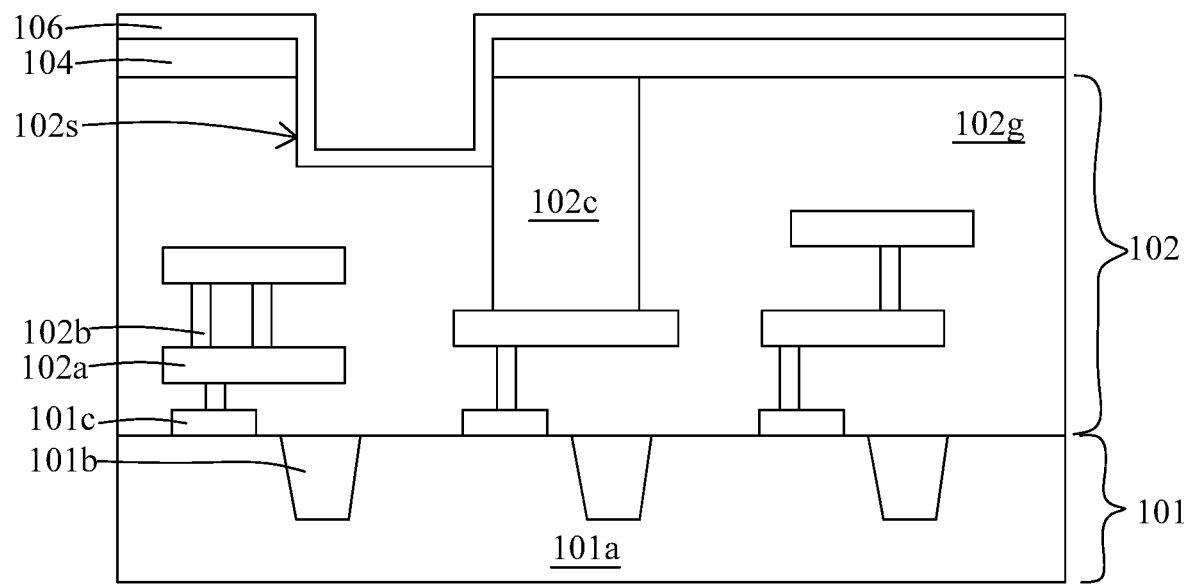
Figure 18:
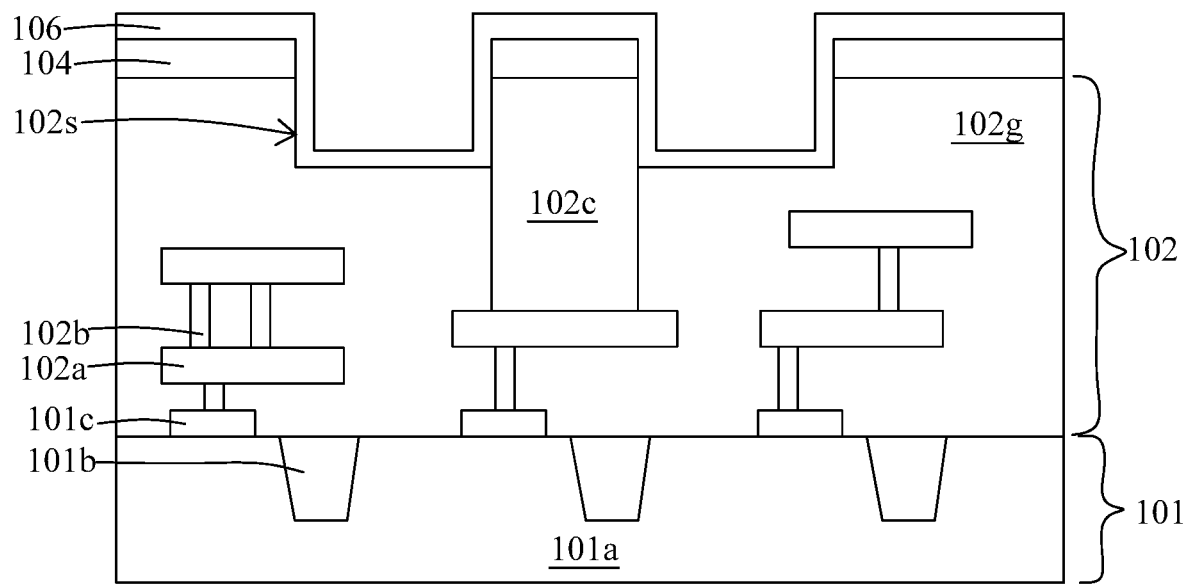

Referring to FIG. 17, a first seed layer 106 is disposed over the etch stop layer 104 and a portion of the dielectric layer 102g that is exposed through the etch stop layer 104 according to a step S206 in FIG. 8. In some embodiments, the first seed layer 106 is disposed conformal to the etch stop layer 104 and the opening 102s. In some embodiments, the first seed layer 106 is disposed conformal to several openings 102s as shown in FIG. 18. In some embodiments, at least a portion of the first seed layer 106 is in contact with the portion of the conductive plug 102c exposed through the opening 102s. In some embodiments, the first seed layer 106 is a single layer or a composite stack and is formed with material such as copper, titanium, tungsten, or a combination thereof. In some embodiments, the first seed layer 106 is disposed by deposition, physical vapor deposition (PVD) or any other suitable process.

Figure 19:
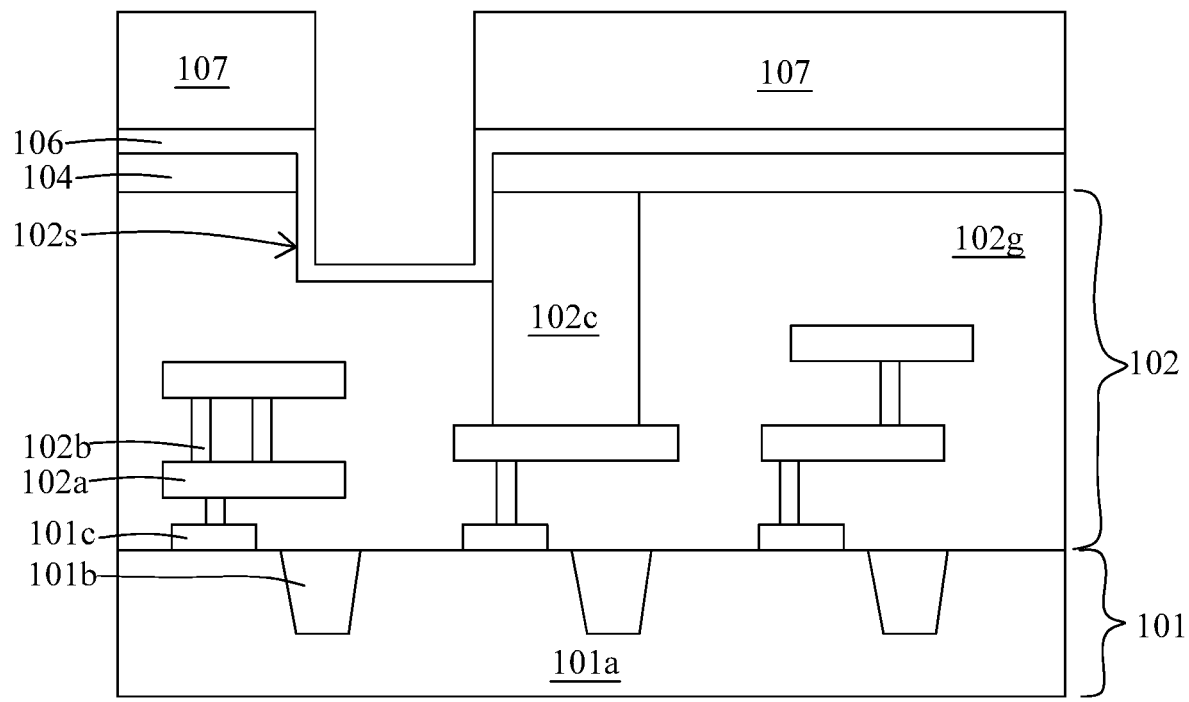
Figure 20:
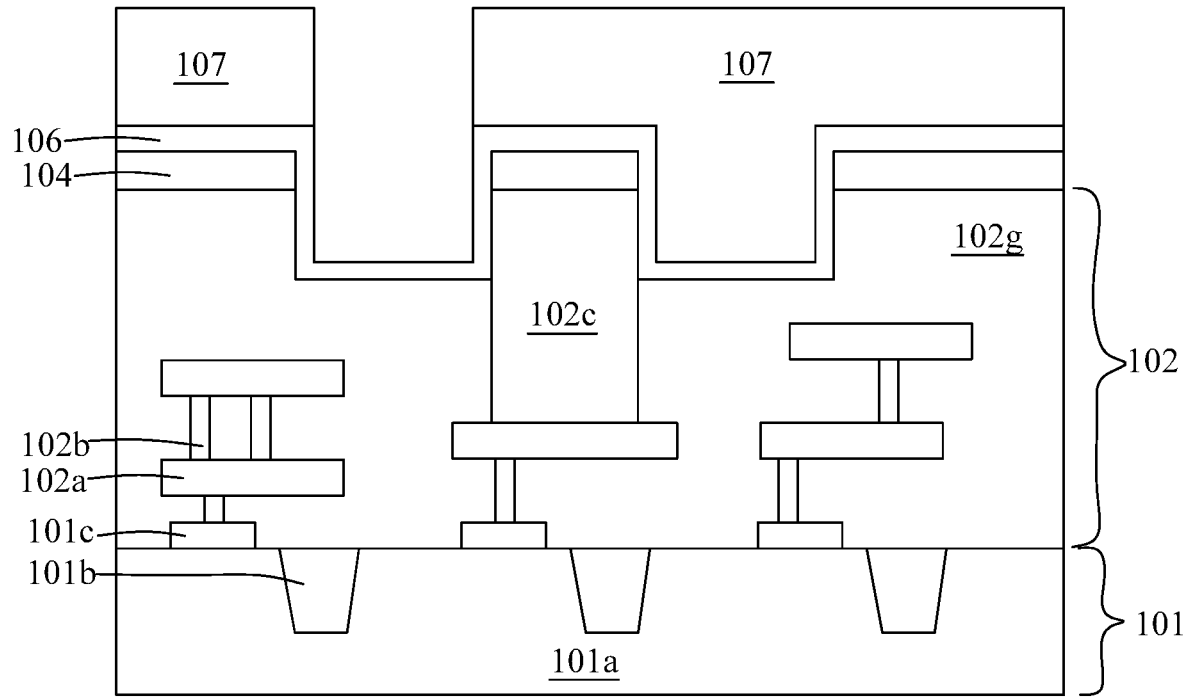

Referring to FIG. 19, a second patterned photoresist 107 is disposed over the first seed layer 106 according to a step S207 in FIG. 8. In some embodiments, the second patterned photoresist 107 is formed by disposing a photoresist material over the first seed layer 106, covering some portions of the photoresist material, and then removing exposed portions of the photoresist material to pattern the photoresist material to form the second patterned photoresist 107. In some embodiments, a portion of the first seed layer 106 is exposed through the second patterned photoresist 107. In some embodiments, the photoresist material is disposed by spin coating or any other suitable process. In some embodiments, a portion of the first seed layer 106 is covered by the second patterned photoresist 107 as shown in FIG. 20. The second patterned photoresist 107 fills the opening 102s. In some embodiments, the second patterned photoresist 107 is at least partially surrounded by the first seed layer 106.

Figure 21:
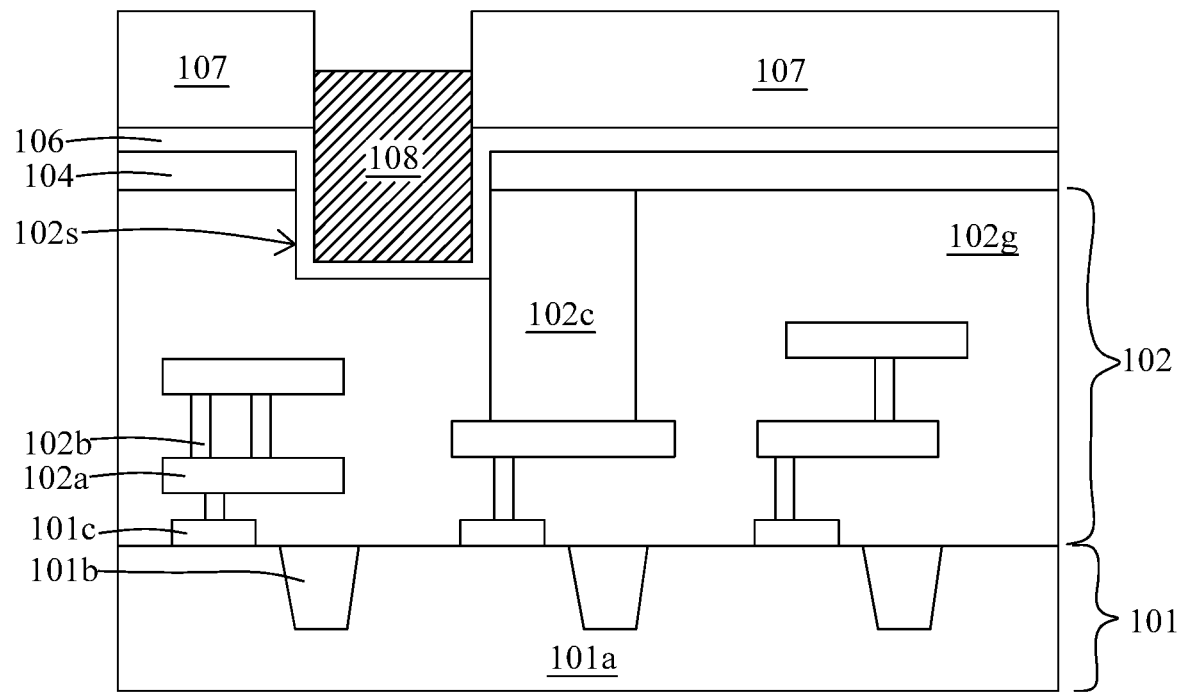
Figure 22:
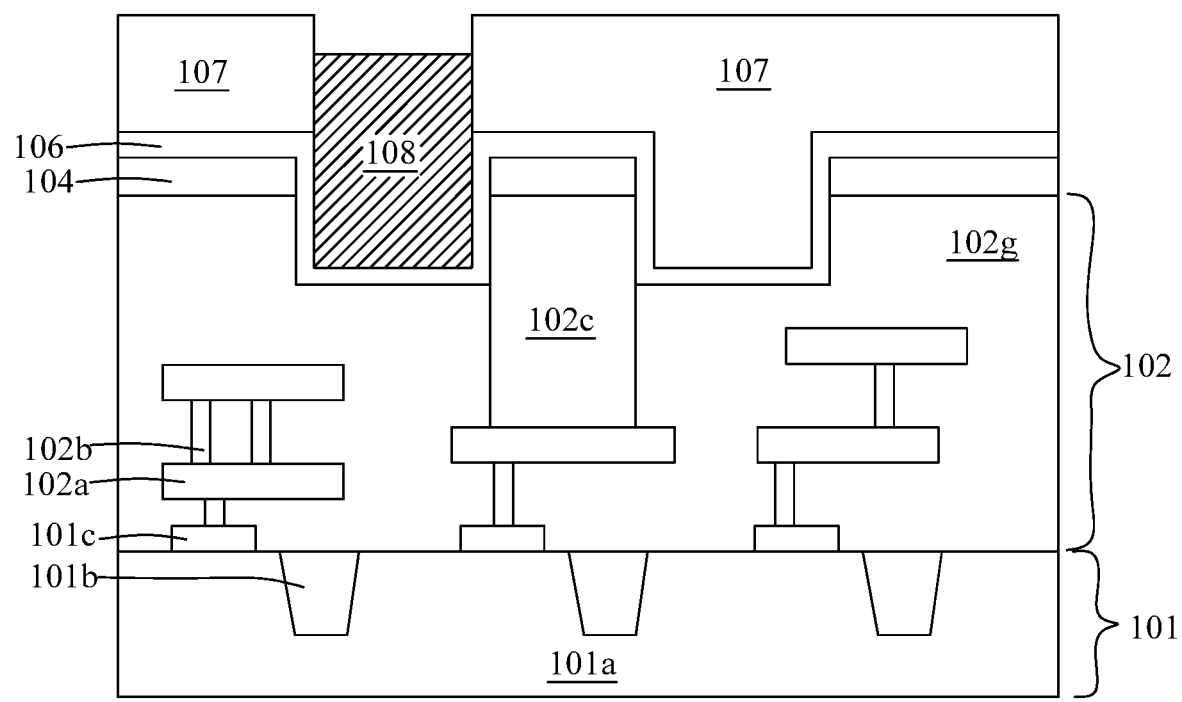

Referring to FIG. 21 or FIG. 22, a conductive material 108 is disposed over the portion of the first seed layer 106 that is exposed through the second patterned photoresist 107 according to a step S208 in FIG. 8. In some embodiments, the conductive material 108 is in contact with the first seed layer 106 and fills the opening 102s. In some embodiments, the conductive material 108 includes copper, silver, gold or the like. In some embodiments, the conductive material 108 is disposed by electroplating or any other suitable process.

Figure 23:
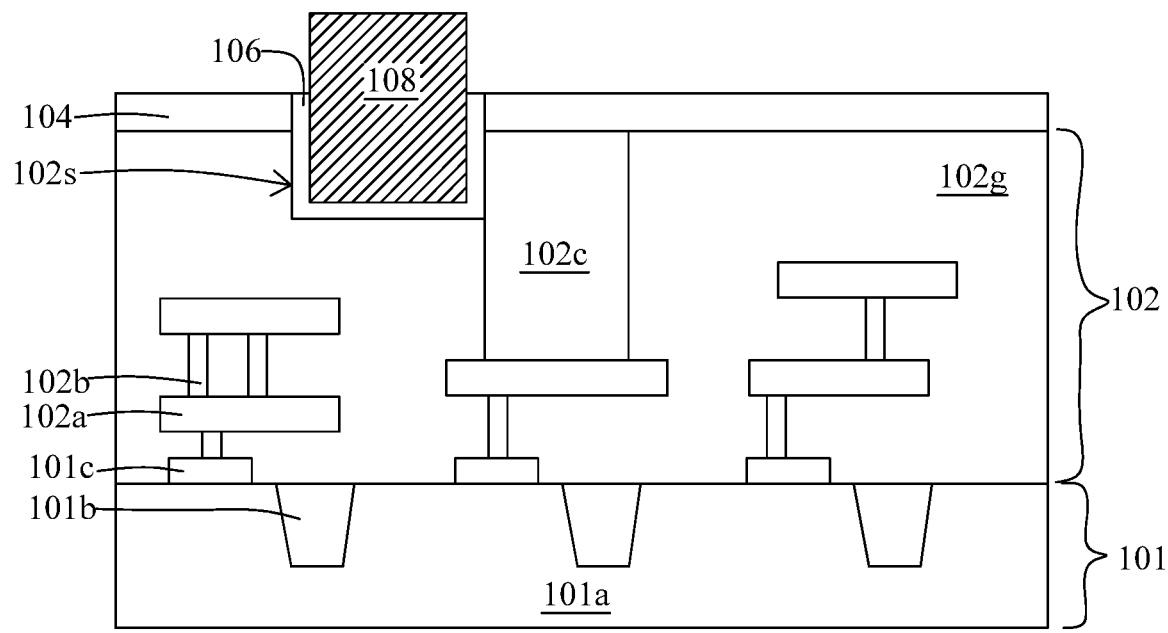

Referring to FIG. 23, the second patterned photoresist 107 is removed according to a step S209 in FIG. 8. In some embodiments, the second patterned photoresist 107 is removed by etching, stripping or any other suitable process. In some embodiments, the opening 102s is exposed after the removal of the second patterned photoresist 107 as shown in FIG. 24.

Figure 25:
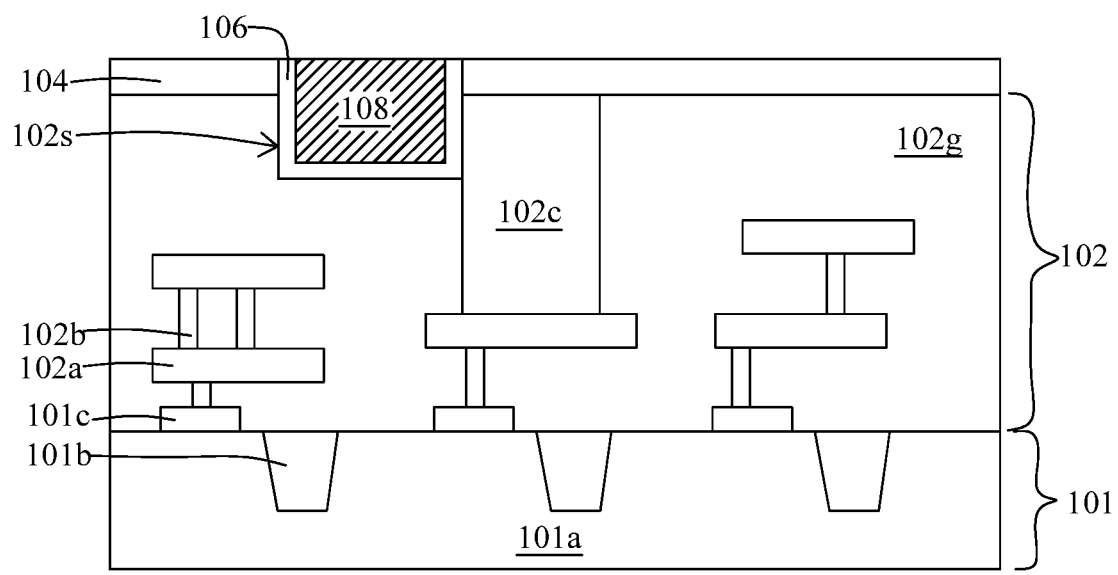

In some embodiments, after the removal of the second patterned photoresist 107 as shown in FIG. 23, a portion of the conductive material 108 that protrudes from the etch stop layer 104 is removed as shown in FIG. 25. In some embodiments, the portion of the conductive material 108 that protrudes from the etch stop layer 104 is removed by etching, planarization, chemical mechanical polishing (CMP) or any other suitable process.

Figure 24:
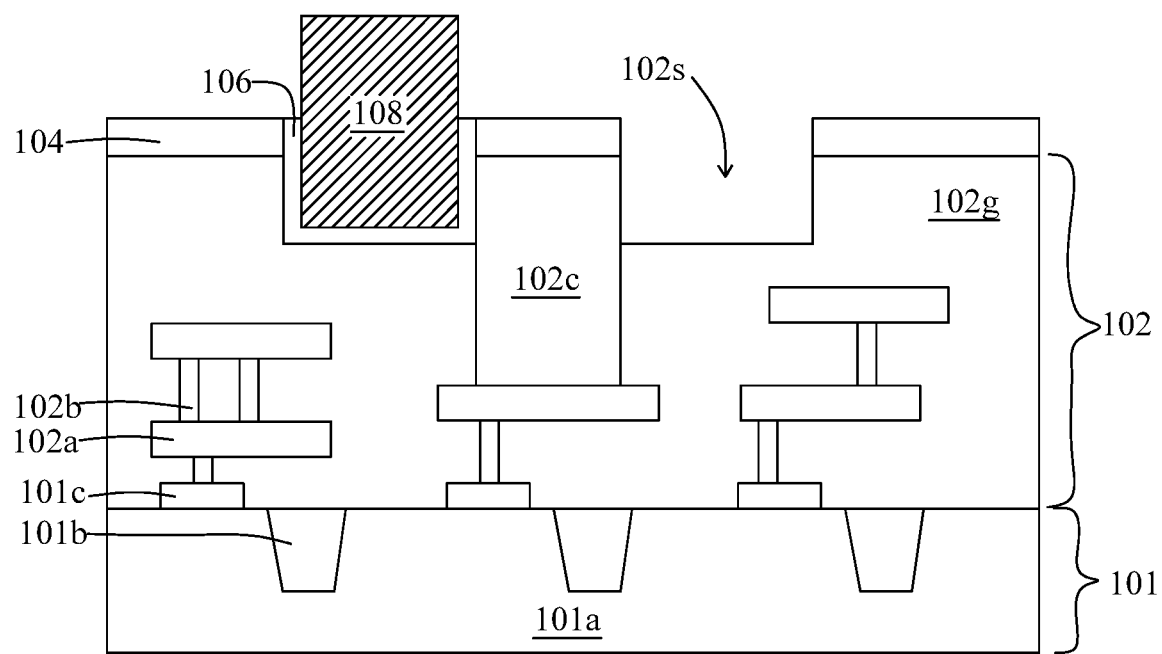
Figure 26:
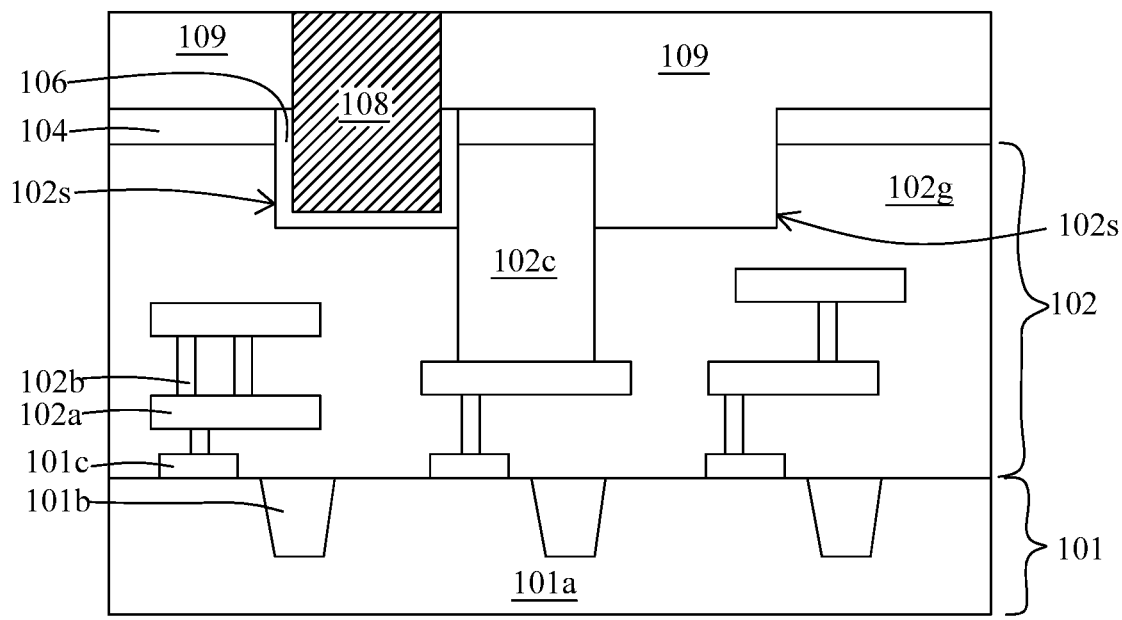
Figure 27:
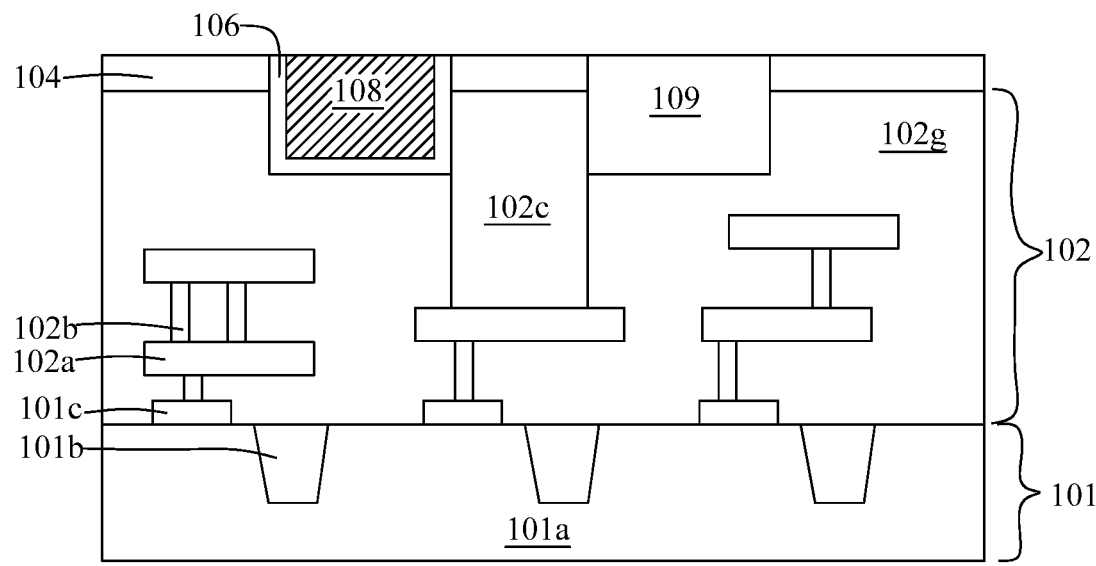

In some embodiments, after the removal of the second patterned photoresist 107 as shown in FIG. 24, an additional dielectric material 109 is disposed over the etch stop layer 104 as shown in FIG. 26. In some embodiments, the additional dielectric material 109 fills the opening 102s. In some embodiments, the additional dielectric material 109 surrounds a portion of the conductive material 108. In some embodiments, the additional dielectric material 109 and the portion of the conductive material 108 that protrudes from the etch stop layer 104 are removed as shown in FIG. 27. In some embodiments, the additional dielectric material 109 and the portion of the conductive material 108 that protrudes from the etch stop layer 104 are removed by etching, chemical mechanical polishing (CMP) or any other suitable processes.

Figure 28:
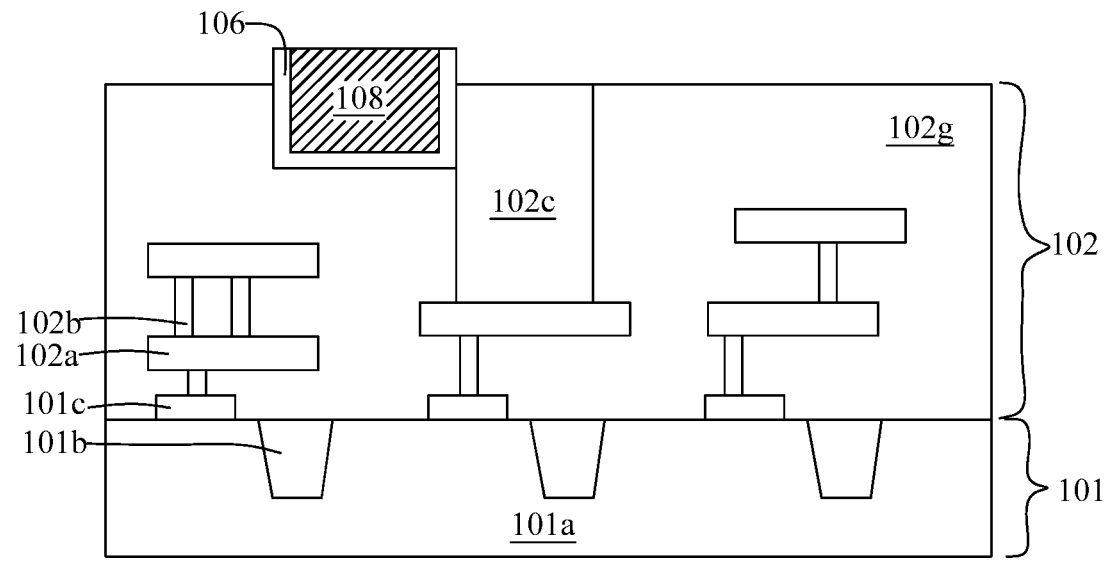
Figure 29:
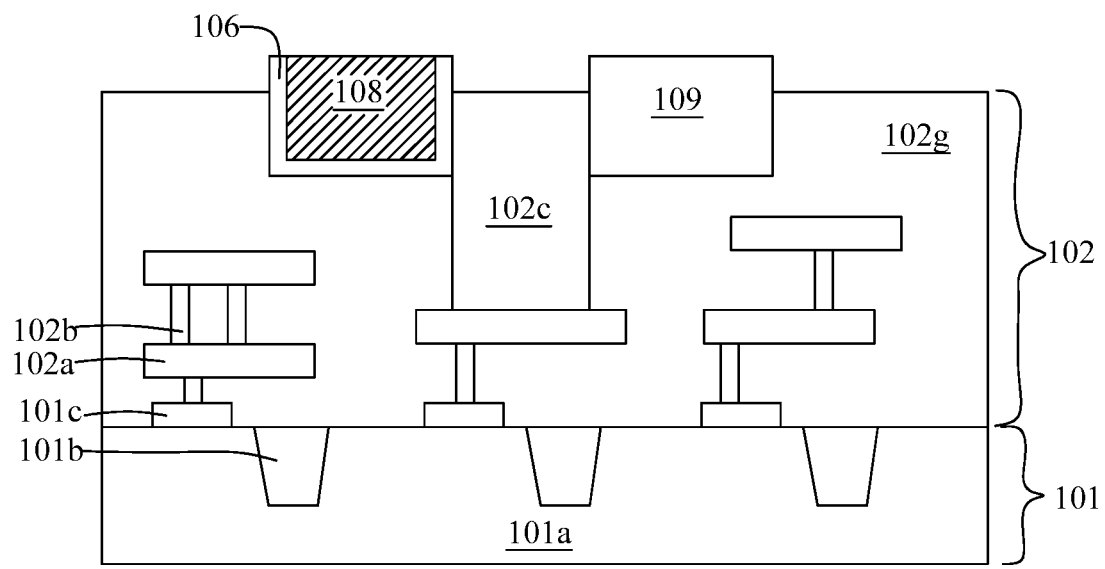

Referring to FIG. 28 or FIG. 29, the etch stop layer 104 is removed according to a step S210 in FIG. 8. In some embodiments, the etch stop layer 104 is removed by etching or any other suitable process. In some embodiments as shown in FIG. 28, a portion of the first seed layer 106 and a portion of the conductive material 108 protrude from the dielectric layer 102g after the removal of the etch stop layer 104. In some embodiments as shown in FIG. 29, a portion of the first seed layer 106, a portion of the conductive material 108 and a portion of the additional dielectric material 109 protrude from the dielectric layer 102g after the removal of the etch stop layer 104.

Figure 30:
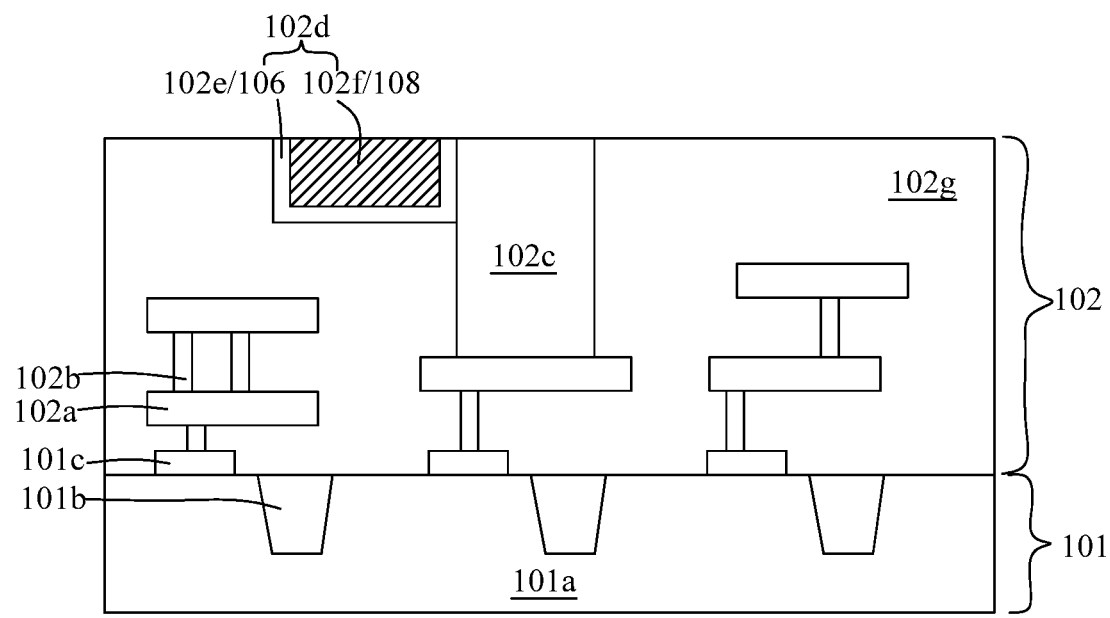
Figure 31:
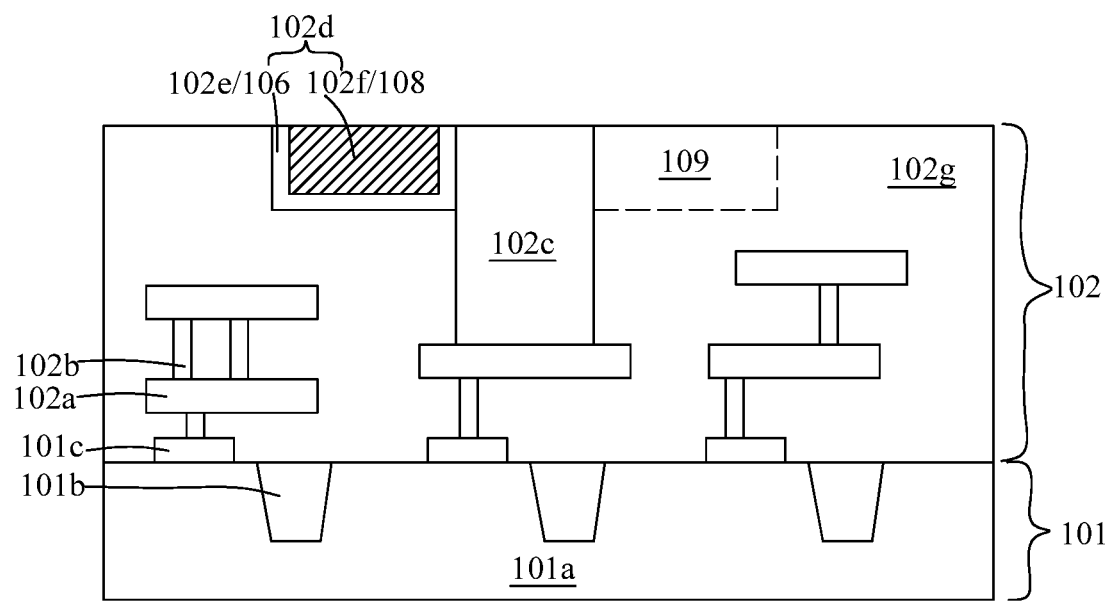

Referring to FIG. 30 or FIG. 31, the portion of the conductive material 108 that protrudes from the dielectric layer 102g is removed to form a bonding pad 102d adjacent to the conductive plug 102c and surrounded by the dielectric layer 102g according to a step S211 in FIG. 8. In some embodiments, the portion of the conductive material 108 and the portion of the first seed layer 106 that protrude from the dielectric layer 102g are removed by etching, planarization, CMP or any other suitable processes. In some embodiments, the bonding pad 102d including a seed layer 102e and a pad 102f is formed. The bonding pad 102d is in contact with the conductive plug 102c. In some embodiments, the portion of the additional dielectric material 109 that protrudes from the dielectric layer 102g is removed as shown in FIG. 31; as a result, a remaining portion of the additional dielectric material 109 is integrated with the dielectric layer 102g.

Figure 32:
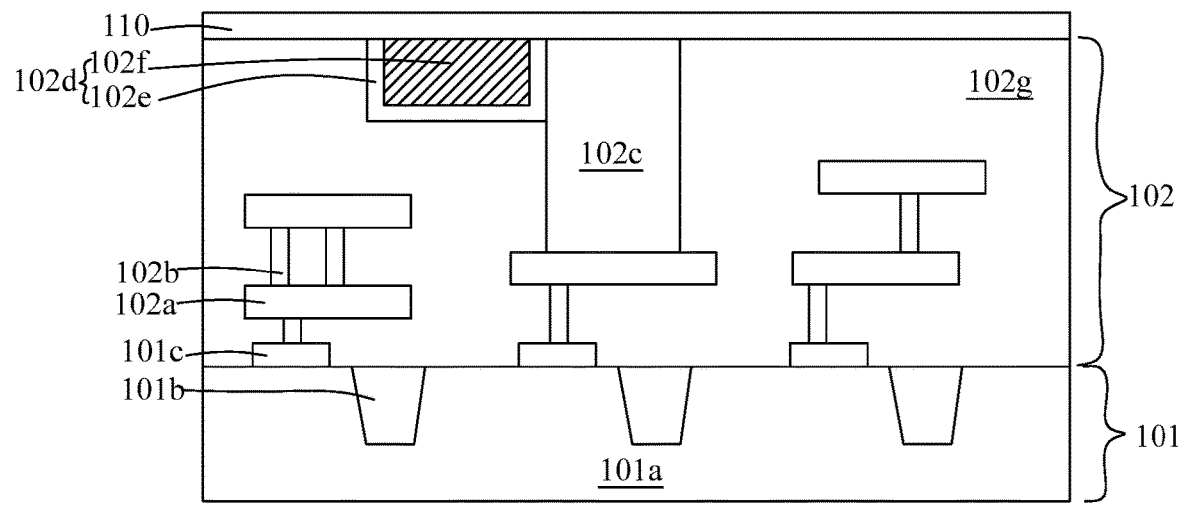

In some embodiments, after the formation of the bonding pad 102d, a second seed layer 110 is disposed over the bonding pad 102d, the conductive plug 102c and the dielectric layer 102g as shown in FIG. 32. In some embodiments, the second seed layer 110 is a single layer or a composite stack and is formed with material such as copper, titanium, tungsten, or a combination thereof. In some embodiments, the second seed layer 110 is disposed by deposition, PVD or any other suitable process.

Figure 33:
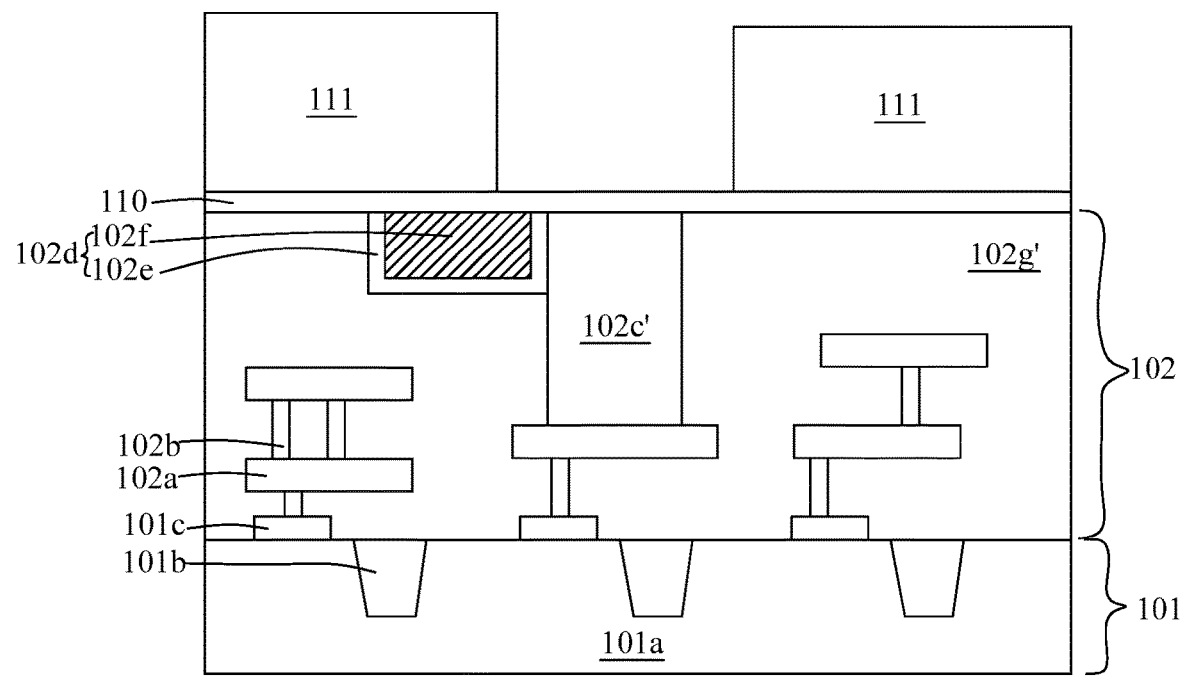

In some embodiments, after the deposition of the second seed layer 110, a third patterned photoresist 111 is disposed over the second seed layer 110 as shown in FIG. 33. In some embodiments, the third patterned photoresist 111 is formed by disposing a photoresist material over the second seed layer 110, covering some portions of the photoresist material, and then removing exposed portions of the photoresist material to pattern the photoresist material to form the third patterned photoresist 111. In some embodiments, a portion of the second seed layer 110 is exposed through the third patterned photoresist 111. In some embodiments, the photoresist material is disposed by spin coating or any other suitable process.

Figure 34:
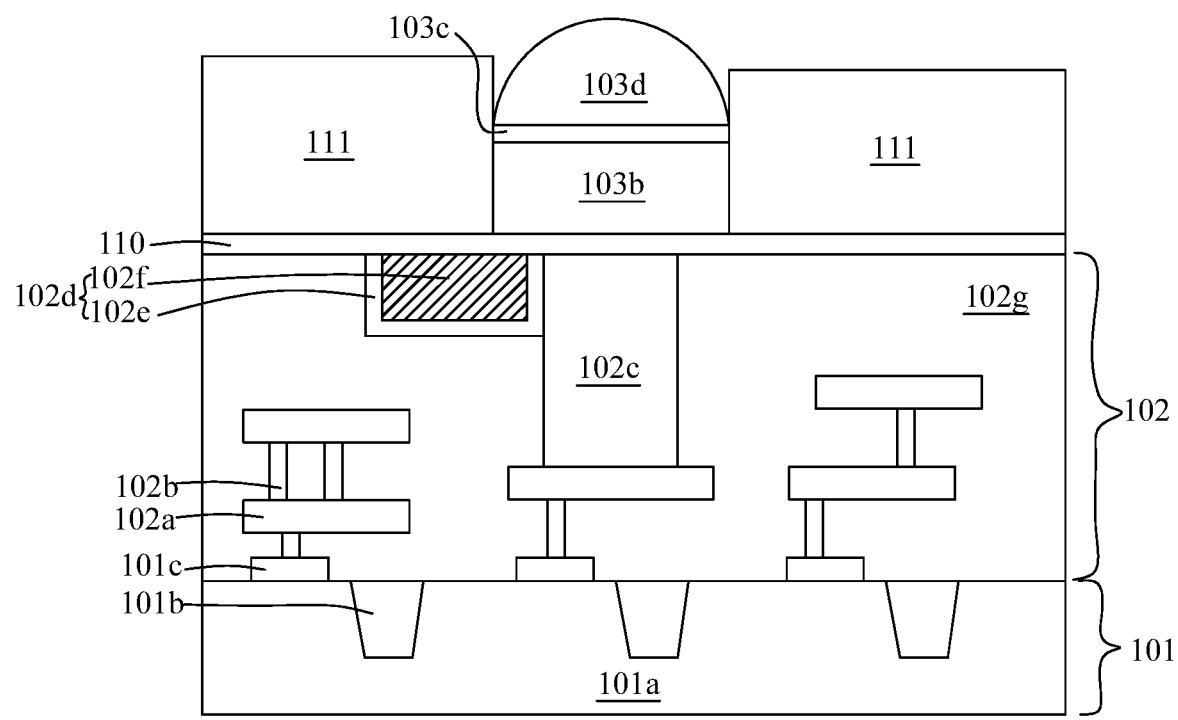
Figure 35:
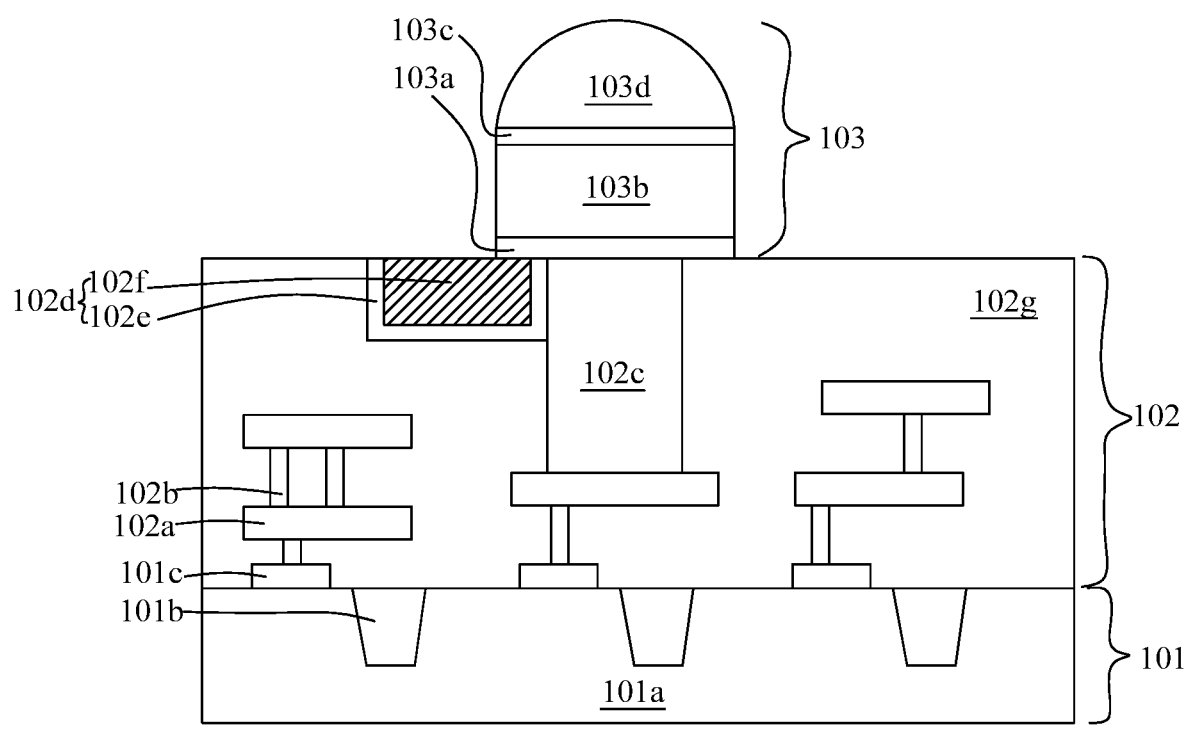

In some embodiments, a conductive bump 103 is formed over the portion of the second seed layer 110 that is exposed through the third patterned photoresist 111 as shown in FIGS. 34 and 35. In some embodiments, a metallic layer 103b, a barrier layer 103c and a soldering member 103d are sequentially disposed over the portion of the second seed layer 110 that is exposed through the third patterned photoresist 111 as shown in FIG. 34. In some embodiments, the metallic layer 103b and the barrier layer 130c are disposed by electroplating, sputtering, deposition or any suitable processes.

In some embodiments, the metallic layer 103b includes conductive material such as copper, silver, gold or the like. In some embodiments, the barrier layer 103c includes titanium, titanium nitride, tantalum, tantalum nitride, nickel or the like. In some embodiments, the soldering member 103d is formed by pasting, deposition or any suitable process. In some embodiments, the soldering member 103d includes tin, lead, silver, copper, nickel or the like. In some embodiments, the soldering member 103d undergoes a reflow process to become dome-shaped.

In some embodiments, after the metallic layer 103b, the barrier layer 103c and the soldering member 103d are disposed, the third patterned photoresist 111 is removed as shown in FIG. 35. In some embodiments, the third patterned photoresist 111 is removed by etching, stripping or any suitable process.

Figure 36:
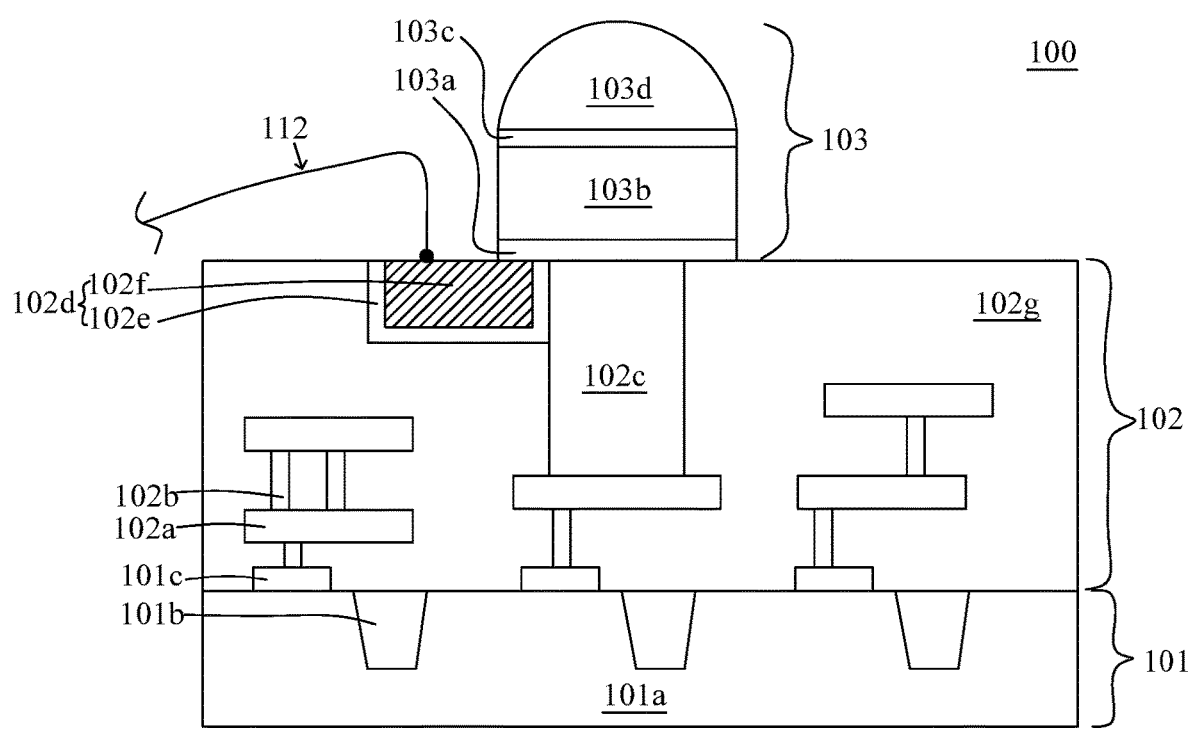

In some embodiments, a portion of the second seed layer 110 that is exposed by the metallic layer 103, the barrier layer 103b and the soldering member 103d is removed to form the UBM layer 103a as shown in FIG. 35. In some embodiments, the portion of the second seed layer 110 that is exposed by the metallic layer 103, the barrier layer 103b and the soldering member 103d is removed by etching or any suitable process. In some embodiments, the conductive bump 103 including the UBM layer 103a, the metallic layer 103b, the barrier layer 103c and the soldering member 103d is formed. In some embodiments, a bonding wire 112 is disposed and bonded over the bonding pad 102d as shown in FIG. 36. The bonding wire 112 electrically connects the semiconductor structure 100 with an external circuitry through the bonding pad 102d.

One aspect of the present disclosure provides a semiconductor structure. The semiconductor structure includes a substrate; a redistribution layer (RDL) disposed over the substrate, and including a dielectric layer over the substrate, a conductive plug extending within the dielectric layer, and a bonding pad adjacent to the conductive plug and surrounded by the dielectric layer; and a conductive bump disposed over the conductive plug, wherein the bonding pad is at least partially in contact with the conductive plug and the conductive bump.

Another aspect of the present disclosure provides a semiconductor structure. The semiconductor structure includes a first substrate; and a redistribution layer (RDL) disposed over the first substrate, and including a dielectric layer over the first substrate, a conductive plug extending within the dielectric layer, and a bonding pad surrounded by the dielectric layer and in contact with the conductive plug, wherein the conductive plug is at least partially surrounded by the bonding pad.

Another aspect of the present disclosure provides a method of manufacturing a semiconductor structure. The method includes steps of providing a substrate and a redistribution layer (RDL) disposed over the substrate, wherein the RDL includes a dielectric layer over the substrate and a conductive plug extending within the dielectric layer; disposing an etch stop layer over the RDL; disposing a first patterned photoresist over the etch stop layer; removing a portion of the dielectric layer and a portion of the etch stop layer that is exposed through the first patterned photoresist; removing the first patterned photoresist; disposing a first seed layer over the etch stop layer and portions of the dielectric layer that are exposed through the etch stop layer; disposing a second patterned photoresist over the first seed layer; disposing a conductive material over a portion of the first seed layer that is exposed through the second patterned photoresist; removing the second patterned photoresist; removing the etch stop layer; and removing a portion of the conductive material that protrudes from the dielectric layer to form a bonding pad adjacent to the conductive plug and surrounded by the dielectric layer.

In conclusion, because a bonding pad is disposed adjacent to a conductive plug in an RDL, the bonding pad can receive an external interconnect structure such as wire bonding. Further, the bonding pad can be formed in various shapes so that the bonding pad can receive the external interconnect structure from different orientations around the conductive plug. Therefore, a flexible interconnection and routing of a semiconductor structure can be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a substrate;
a redistribution layer (RDL) disposed over the substrate, and including a dielectric layer over the substrate, a conductive plug extending within the dielectric layer, and a bonding pad adjacent to the conductive plug and surrounded by the dielectric layer; and
a conductive bump disposed over the conductive plug,
wherein the bonding pad includes a first seed layer and a pad section surrounded by the first seed layer, and the first seed layer is deposited between the conductive plug and the pad section;
wherein the bonding pad is at least partially in contact with the conductive plug and the conductive bump.

2. The semiconductor structure of claim 1, wherein a first surface of the conductive plug and a second surface of the bonding pad are exposed through the dielectric layer.

3. The semiconductor structure of claim 2, wherein the first surface of the conductive plug is substantially coplanar with the second surface of the bonding pad.

4. The semiconductor structure of claim 2, wherein the first surface of the conductive plug and the second surface of the bonding pad are in contact with a second seed layer of the conductive bump.

5. The semiconductor structure of claim 2, wherein the first surface of the conductive plug, the second surface of the bonding pad and a third surface of the dielectric layer are substantially coplanar.

6. The semiconductor structure of claim 2, wherein the first surface of the conductive plug is entirely covered by the conductive bump.

7. The semiconductor structure of claim 2, wherein a first portion of the second surface of the bonding pad is covered by the conductive bump, a second portion of the second surface is exposed through the dielectric layer and exposed by the conductive bump, and the first portion is substantially smaller than the second portion.

8. The semiconductor structure of claim 1, wherein a top cross section of the bonding pad has an annular shape, a fan shape or a polygonal shape.

9. The semiconductor structure of claim 1, wherein a height of the conductive plug is substantially greater than a thickness of the bonding pad.

10. The semiconductor structure of claim 1, wherein the RDL includes a conductive member electrically connecting the conductive plug to the substrate.

11. The semiconductor structure of claim 10, wherein the conductive member is electrically connected to the conductive bump through the conductive plug.

12. The semiconductor structure of claim 10, wherein the conductive member is electrically connected to the bonding pad through the conductive plug.

13. A semiconductor structure, comprising:
a first substrate; and
a redistribution layer (RDL) disposed over the first substrate, and including a dielectric layer over the first substrate, a conductive plug extending within the dielectric layer, and a bonding pad surrounded by the dielectric layer and in contact with the conductive plug, wherein the bonding pad includes a seed layer and a pad section surrounded by the seed layer, and the seed layer is deposited between the conductive plug and the pad section;
wherein the conductive plug is at least partially surrounded by the bonding pad.

14. The semiconductor structure of claim 13, further comprising a conductive bump covering the conductive plug and partially covering the bonding pad.

15. The semiconductor structure of claim 14, wherein a width of the conductive plug is substantially less than a width of the conductive bump.

16. The semiconductor structure of claim 14, wherein an interface between the conductive plug and the bonding pad is disposed under the conductive bump.

17. The semiconductor structure of claim 14, wherein the conductive bump is disposed over and bonded with an interconnect structure of a second substrate.

18. The semiconductor structure of claim 14, wherein the bonding pad includes a first bonding pad and a second bonding pad separated from the first bonding pad, and the conductive plug is disposed between the first bonding pad and the second bonding pad.

19. The semiconductor structure of claim 14, further comprising a bonding wire disposed over and bonded with the bonding pad.

20. The semiconductor structure of claim 14, wherein the first substrate includes a plurality of devices disposed thereon and a plurality of isolations separating the plurality of devices.

* * * * *